(12) United States Patent
Perreault et al.

(10) Patent No.: US 9,755,672 B2
(45) Date of Patent: *Sep. 5, 2017

(54) INTEGRATED POWER SUPPLY AND MODULATOR FOR RADIO FREQUENCY POWER AMPLIFIERS

(71) Applicant: Eta Devices, Inc., Cambridge, MA (US)

(72) Inventors: David J. Perreault, Andover, MA (US); Wei Li, Monterey, CA (US); Yevgeniy A. Tkachenko, Belmont, MA (US); Joel L. Dawson, Roslindale, MA (US)

(73) Assignee: Eta Devices, Inc., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/619,737

(22) Filed: Feb. 11, 2015

(65) Prior Publication Data

US 2015/0155895 A1    Jun. 4, 2015

Related U.S. Application Data

(63) Continuation-in-part of application No. 14/035,445, filed on Sep. 24, 2013.
(Continued)

(51) Int. Cl.
*H04B 1/04* (2006.01)
*H03F 3/19* (2006.01)
(Continued)

(52) U.S. Cl.
CPC ............ *H04B 1/0458* (2013.01); *H02M 3/07* (2013.01); *H02M 3/158* (2013.01);
(Continued)

(58) Field of Classification Search
CPC ...... H02M 3/155; H02M 3/156; H02M 3/158; H02M 3/1582; H02M 3/1584;
(Continued)

(56) References Cited

U.S. PATENT DOCUMENTS 7,103,114 B1    9/2006  Lapierre
7,482,869 B2    1/2009  Wilson
(Continued)

FOREIGN PATENT DOCUMENTS

WO    WO 2005/106613 A1    11/2005
WO    WO 2006/119362 A2    11/2006
(Continued)

OTHER PUBLICATIONS

U.S. Appl. No. 14/968,045, filed Dec. 14, 2015, Perreault et al.
(Continued)

*Primary Examiner* — Timothy J Dole
*Assistant Examiner* — Carlos Rivera-Perez
(74) *Attorney, Agent, or Firm* — Daly, Crowley, Mofford & Durkee, LLP

(57) ABSTRACT

Described embodiments provide an integrated power supply and modulator system. The system includes a magnetic regulation stage, a switched-capacitor voltage balancer stage, and at least one output switching stage. The switched-capacitor voltage balancer stage is coupled to an output of the magnetic regulation stage, and maintains a substantially ratiometric set of voltages with respect to a reference potential. The magnetic regulation stage includes an inductor and at least two switches to selectively couple the inductor to two or more of (a) an input of the magnetic regulation stage, (b) a first voltage node of the switched-capacitor voltage balancer stage, and (c) a second voltage node of the switched-capacitor voltage balancer stage. The output switching stage selectively couples at least two voltages
(Continued)

from the switched-capacitor voltage balancer stage to an output of the system in response to control signals. The system may include startup circuitry, feedback/feedforward circuitry, and control circuitry.

22 Claims, 18 Drawing Sheets

Related U.S. Application Data

(60) Provisional application No. 61/939,210, filed on Feb. 12, 2014.

(51) Int. Cl.
| | |
|---|---|
| H03F 3/00 | (2006.01) |
| H02M 3/158 | (2006.01) |
| H04B 7/06 | (2006.01) |
| H03F 1/02 | (2006.01) |
| H03F 3/217 | (2006.01) |
| H02M 3/07 | (2006.01) |
| H03F 3/24 | (2006.01) |
| H03F 3/68 | (2006.01) |
| H02M 1/36 | (2007.01) |
| H02M 1/00 | (2006.01) |

(52) U.S. Cl.
CPC .......... *H03F 1/0227* (2013.01); *H03F 3/005* (2013.01); *H03F 3/19* (2013.01); *H03F 3/2178* (2013.01); *H03F 3/245* (2013.01); *H03F 3/68* (2013.01); *H04B 7/06* (2013.01); *H02M 1/36* (2013.01); *H02M 3/1588* (2013.01); *H02M 2001/007* (2013.01); *H02M 2001/009* (2013.01); *H02M 2001/0058* (2013.01); *H03F 2200/102* (2013.01); *H03F 2200/111* (2013.01); *H03F 2200/451* (2013.01); *Y02B 70/1466* (2013.01); *Y02B 70/1491* (2013.01)

(58) Field of Classification Search
CPC .. H02M 3/1588; H02M 3/33546; H02M 3/06; H02M 3/07; H02M 3/073; H02M 2001/0045; H02M 2001/0067; H02M 2001/007; H02M 2001/0074; H02M 2001/0077; H02M 2001/008; H02M 2003/071; H02M 2003/072; H02M 2003/077; H02M 2003/075; H02M 2003/076; H02M 2003/078; H02M 3/00; H02M 3/02; H02M 3/04; H02M 3/10; H02M 3/145; H02M 2001/009; H02M 2001/0058; H02M 2003/1552; H02M 1/36; H04B 1/0458; H04B 7/06; H03F 3/19; H03F 3/21; H03F 3/005; H03F 1/0216; H03F 3/2178; H03F 3/245; H03F 3/68; H03F 1/0227; H03F 2200/102; H03F 2200/111; H03F 2200/451; H02J 7/0068; Y02B 70/1466; Y02B 70/1491
USPC ........ 323/222–226, 266–275, 282–288, 351, 323/901, 205–211; 363/21.06, 21.14, 59, 363/60, 62, 65–70, 123–127; 320/116–123, 137, 140, 141, 145, 166, 320/167; 327/535–537; 330/296, 297, 330/127, 136; 307/109, 110
See application file for complete search history.

(56) References Cited

U.S. PATENT DOCUMENTS

| | | | |
|---|---|---|---|
| 7,535,133 B2 | 5/2009 | Perreault et al. | |
| 7,589,605 B2 | 9/2009 | Perreault et al. | |
| 7,889,519 B2 | 2/2011 | Perreault et al. | |
| 8,026,763 B2 | 9/2011 | Dawson et al. | |
| 8,164,384 B2 | 4/2012 | Dawson et al. | |
| 8,212,541 B2 | 7/2012 | Perreault et al. | |
| 8,451,053 B2 | 5/2013 | Perreault et al. | |
| 8,503,203 B1 | 8/2013 | Szczeszynski et al. | |
| 8,718,188 B2 | 5/2014 | Balteanu et al. | |
| 2005/0194951 A1 | 9/2005 | Mehas et al. | |
| 2008/0003960 A1* | 1/2008 | Zolfaghari | H03C 5/00 455/127.3 |
| 2008/0019459 A1 | 1/2008 | Chen et al. | |
| 2009/0332414 | 12/2009 | Oraw et al. | |
| 2010/0073084 A1 | 3/2010 | Hur et al. | |
| 2010/0117727 A1* | 5/2010 | Dawson | H03F 1/0244 330/124 R |
| 2012/0176195 A1 | 7/2012 | Dawson et al. | |
| 2012/0313602 A1 | 12/2012 | Perreault et al. | |
| 2012/0326684 A1 | 12/2012 | Perreault et al. | |
| 2013/0187612 A1* | 7/2013 | Aiura | H01M 10/425 320/118 |
| 2013/0229841 A1 | 9/2013 | Giuliano | |
| 2013/0241625 A1 | 9/2013 | Perreault et al. | |
| 2013/0251066 A1 | 9/2013 | Kim et al. | |
| 2013/0343106 A1 | 12/2013 | Perreault et al. | |
| 2013/0343107 A1 | 12/2013 | Perreault | |
| 2014/0118063 A1 | 5/2014 | Briffa et al. | |
| 2014/0118065 A1 | 5/2014 | Briffa et al. | |
| 2014/0118072 A1 | 5/2014 | Briffa et al. | |
| 2014/0120854 A1 | 5/2014 | Briffa et al. | |
| 2014/0125412 A1 | 5/2014 | Dawson et al. | |
| 2014/0132354 A1 | 5/2014 | Briffa et al. | |
| 2014/0167513 A1 | 6/2014 | Chang et al. | |
| 2014/0226378 A1 | 8/2014 | Perreault | |
| 2014/0306648 A1 | 10/2014 | Le et al. | |

FOREIGN PATENT DOCUMENTS

| | | |
|---|---|---|
| WO | WO 2007/082090 A2 | 7/2007 |
| WO | WO 2007/094921 A1 | 8/2007 |
| WO | WO 2010/056646 A1 | 5/2010 |
| WO | WO 2010/081843 A2 | 7/2010 |
| WO | WO 2011/097387 A1 | 8/2011 |
| WO | WO 2012/151466 A2 | 11/2012 |
| WO | WO2013086445 A1 | 6/2013 |
| WO | WO 2013/109719 A1 | 7/2013 |
| WO | WO 2013/109743 A2 | 7/2013 |
| WO | WO 2013/109797 A1 | 7/2013 |
| WO | WO 2013/134573 A1 | 9/2013 |
| WO | WO 2013/191757 A1 | 12/2013 |
| WO | WO 2014/004241 A2 | 1/2014 |
| WO | WO 2014/028441 A2 | 2/2014 |
| WO | WO 2014/070474 A1 | 5/2014 |
| WO | WO 2014/070475 A1 | 5/2014 |
| WO | WO 2014/070998 A1 | 5/2014 |
| WO | WO 2014/085097 A1 | 6/2014 |

OTHER PUBLICATIONS

U.S. Appl. No. 14/974,563, filed Dec. 18, 2015, Perreault et al.
U.S. Appl. No. 14/975,742, filed Dec. 19, 2015, Perreault et al.
Final Office Action dated Dec. 30, 2015; for U.S. Appl. No. 14/035,445; 24 pages.
U.S. Appl. No. 14/338,671, filed Jul. 23, 2014, Briffa, et al.
U.S. Appl. No. 14/035,445, filed Sep. 24, 2013, Perreault.
Choi, et al.; "A ΔΣ-Digitized Polar RF Transmitter;" IEEE Transactions on Microwave Theory and Techniques; vol. 55; No. 12; Dec. 2007; pp. 2679-2690.
Godoy, et al.; "A 2.4-GHz, 27-dBm Asymmetric Multilevel Outphasing Power Amplifier in 65-nm CMOS;" IEEE Journal of Solid-State Circuits; vol. 47; No. 10; Oct. 2012; pp. 2372-2384.

(56) References Cited

OTHER PUBLICATIONS

Pilawa-Podgurski, et al.; "Merged Two-Stage Power Converter with Soft Charging Switched-Capacitor Stage in 180 nm CMOS;" IEEE Journal of Solid-State Circuits; vol. 47; No. 7; Jul. 2012; pp. 1557-1567.
Rabb; "Average Efficiency of Class-G Power Amplifiers;" IEEE Transactions on Consumer Electronics; Vo. CE-32; No. 2, May 1986; pp. 145-150.
Seeman, et al.; "Analysis and Optimization of Switched Capacitor DC-DC Converters;" IEEE Transactions on Power Electronics; vol. 23; No. 2; Mar. 2008; pp. 841-851.
Vasic, et al.; "Comparison of Two Multilevel Architectures for Envelope Amplifier;" IEEE Industrial Electronics Conference; Jan. 2009; pp. 283-289.
Vasic, et al.; "Multilevel Power Supply for High Efficiency RF Amplifiers;" IEEE Amplifiers Power Electronics Conference; Feb. 2009; pp. 1233-1238.
Walling, et al.; "A Class-G Supply Modulator and Class-E PA in 130 nm CMOS;" IEEE Journal of Solid-State Circuits; vol. 44; No. 9; Sep. 2009; pp. 2339-2347.
Briffa, et al.; "Transmitter Architecture and Related Methods;" Patent Application filed Oct. 30, 2012; U.S. Appl. No. 13/663,878.
Briffa, et al.; "RF Amplifier Architecture and Related Techniques;" Patent Application filed Oct. 30, 2012; U.S. Appl. No. 13/663,887.
Ahsanuzzaman, et al.; "A Low-Volume Power Management Module for Portable Applications Based on a Multi-Output Switched-Capacitor Circuit;" Applied Power Electronics Conference and Exposition (APEC); 2013 Twenty-Eighth Annual IEEE; Mar. 17-21, 2013; pp. 1473-1479.
U.S. Appl. No. 14/934,760, filed Nov. 6, 2015, Briffa, et al.
U.S. Appl. No. 14/920,031, filed Oct. 22, 2015, Briffa, et al.
Request for Continued Examination (RCE) and Response to Final Office Action dated Dec. 30, 2015 for U.S. Appl. No. 14/035,445; RCE and Response filed on Mar. 2, 2016; 16 Pages.
Chang, et al.; "Multistage multiphase switched-capacitor DC-DC converter with variable-phase and PWM control;" International Journal of Circuit Theory and Applications; Int. J. Circ. Theor. Appl. 2002; 40:835-857; Published online Mar. 2, 2011 in Wiley Online Library.
PCT Search Report of the ISA for PCT/US2015/15372 dated May 20, 2015.
PCT Written Opinion of the ISA for PCT/US2015/15372 dated May 20, 2015.
U.S. Appl. No. 15/149,491, filed May 9, 2016, Perreault, et al.
Non-Final Office Action dated Jun. 8, 2016; for U.S. Appl. No. 14/035,445, 12 pages.
U.S. Appl. No. 14/758,033, filed Jun. 26, 2015, Perreault, et al.
U.S. Appl. No. 14/791,685, filed Jul. 6, 2016, Perreault, et al.
Non-Final Office Action dated Aug. 7, 2015; for U.S. Appl. No. 14/619,737; 33 pages.
Response filed on Aug. 19, 2015 to a Non-Final Office Action dated Aug. 7, 2015; for U.S. Appl. No. 14/035,445; 29 Pages.
U.S. Appl. No. 14/837,616, filed Aug. 27, 2015, Briffa, et al.
U.S. Appl. No. 14/823,220, filed Aug. 11, 2015, Barton, et al.
U.S. Appl. No. 15/290,402, filed Oct. 11, 2016, Perreault, et al.
U.S. Appl. No. 15/287,068, filed Oct. 6, 2016, Briffa, et al.
U.S. Appl. No. 15/354,170, filed Nov. 17, 2016, Briffa, et al.
Notice of Appeal filed Nov. 23, 2016; for U.S. Appl. No. 14/035,445; 1 page.
Final Office Action dated Aug. 26, 2016; for U.S. Appl. No. 14/035,445; 21 pages.
Appeal Brief from U.S. Appl. No. 14/035,445, as filed on Jan. 23, 2017; 21 Pages.
Examiner's answers to Appeal Brief filed on Jan. 23, 2017 from U.S. Appl. No. 14/035,445 dated May 4, 2017; 9 Pages.

* cited by examiner

INTEGRATED POWER SUPPLY AND MODULATOR FOR RADIO FREQUENCY POWER AMPLIFIERS

CROSS REFERENCE TO RELATED APPLICATION

The present application claims the benefit of U.S. Provisional Patent Application No. 61/939,210 filed on Feb. 12, 2014, which is incorporated by reference herein in its entirety. The present application is also a continuation-in-part of U.S. patent application Ser. No. 14/035,445 filed Sep. 24, 2013, which is incorporated by reference herein in its entirety.

BACKGROUND

As is known in the art, efficiency improvement of radio frequency (RF) systems which employ one or more power amplifiers (PAs) can be achieved through supply (e.g. drain or collector) modulation, in which a voltage applied to the one or more PAs is dynamically changed according to characteristics of an RF signal being generated. A drain voltage can be changed on a time scale that is slow compared to amplitude variations of the RF signal (e.g., "adaptive bias"), or can be changed on a time scale in accordance with rapid variations of the RF signal amplitude (e.g., as is done in envelope tracking, polar modulation, "class G" power amplification, multilevel backoff, multilevel linear amplification with nonlinear components (LINC), Asymmetric Multilevel Outphasing (AMO), etc.).

Some systems providing drain modulation dynamically select an intermediate voltage from a set of discrete voltage levels, and then provide further regulation to synthesize a continuously variable drain voltage (e.g., for partially realizing a desired envelope in the output, e.g., "envelope tracking"). Other systems directly switch the drain voltage among discrete voltage levels. Such systems include "class G" amplifiers, multi-level LINC (MLINC) power amplifiers, asymmetric multilevel outphasing (AMO) power amplifiers, and multilevel backoff amplifiers (including "asymmetric multilevel backoff" amplifiers) and digitized polar transmitters.

In each of the systems above, two important functions are: 1) providing means to create multiple supply levels from a single supply input, possibly including regulation of the multiple discrete supply voltages; and 2) providing means to rapidly and efficiently switch among the discrete supply voltages. These two tasks can be performed separately, or—in some cases—together. The first task is sometimes accomplished using a multi-output power converter to synthesize multiple supply levels from a single input, and then using a switching network to select from among them. Multiple levels can be realized using a variety of techniques such as through multi-output magnetic converters, and/or through the multi-output switched-capacitor converters, and use of a plurality of converters. The second function is sometimes provided by selecting from among the set of discrete voltage levels via a switching network. These two functions can be performed together in a single structure, such as through use of a reconfigurable switched-capacitor voltage modulator.

SUMMARY

In accordance with the concepts sought to be protected, described herein are systems, circuits, and techniques for realizing a high-frequency voltage modulation system.

In one embodiment, an integrated power supply and modulator system includes a switched-capacitor (SC) voltage balancer stage coupled between a magnetic regulation stage and at least one output switching stage. With this particular arrangement, an integrated power supply and modulator system utilizes both magnetic and capacitive energy transfer in a cooperative manner to achieve both regulation and high efficiency operation. Alternative operating modes are possible in which regulation of the supply voltages is not sought, with energy transferred among levels through capacitive energy transfer only; such a mode can provide still higher efficiency, giving up to an extent the ability to efficiently regulate the voltages. Energy is provided into the integrated power supply and regulation system via the magnetic regulation stage and voltage signals having desired levels are delivered to one or more power amplifiers via the at least one output switching stages. In operation, energy coupled from an input to the magnetic regulation stage is used to generate a plurality of intermediate voltage levels having ratiometrically-related voltage levels at the outputs of the switched capacitor voltage balancer stage. The switched-capacitor voltage balancer stage (which may be more generally referred to as a multi-output switched-capacitor voltage converter) functions to regulate relative voltages on a set of capacitors, such that the capacitor voltages with respect to a common potential maintain a desired ratiometric relationship. These voltages represent, for example, a set of discrete supply voltages utilized for supply switching. The at least one output switching stage is coupled to rapidly select among these ratiometrically-related voltage levels and supply at least one output voltage. The output can be selected directly as one of these voltages, or additional filtering or other processing can be performed to provide a continuously-variable output voltage signal. Thus, the magnetic stage regulates the voltage, while the SC voltage balancer stage maintains the voltage ratios.

With this particular arrangement, a circuits and techniques suitable for operating from a variable dc input voltage are provided. Furthermore, where desired, this approach can be used regulate the plurality of intermediate voltage values. Furthermore, the circuits and techniques described herein are suitable for implementing a semiconductor circuit in a low-voltage CMOS semiconductor process on a single die, with a relatively small number of interconnects (compared with prior art techniques) required to connect the die to components off-die (potentially such as inductors and capacitors), and requiring devices and capacitors having relatively small voltage ratings and passive components such as inductors and capacitors having relatively small sizes and values (compared with prior art techniques) required to support the intermediate voltage levels. In one embodiment, the output switching stage for switching among the different levels is implemented with CMOS devices in a manner that enables high switching speed at high efficiency, without the need for "floating" or "flying" switch drivers.

In accordance with one aspect of the concepts, systems, circuits, and techniques described herein, an integrated power supply and modulator system comprises: (a) a magnetic regulation stage having an input to receive an input voltage and at least one output to deliver a regulated output voltage; (b) a switched-capacitor voltage balancer stage having a plurality of voltage nodes to carry corresponding generated voltages, at least one of the plurality of voltage nodes being coupled to an output of the magnetic regulation stage, wherein the switched-capacitor voltage balancer stage is configured to maintain a substantially ratiometric set of voltages on the plurality of voltage nodes with respect to a reference potential; and (c) an output switching stage to selectively couple at least one voltage from one of the voltage nodes of the switched-capacitor voltage balancer stage to an output of the output switching stage in response to one or more control signals; wherein the magnetic regulation stage includes: (i) an inductor having a first end and a second end; (ii) a set of at least two switches selectively coupling at least one of the first and second ends of the inductor among two or more of (a) the input of the magnetic regulation stage; (b) a first voltage node in the plurality of voltage nodes of the switched-capacitor voltage balancer stage; and (c) a second voltage node in the plurality of voltage nodes of the switched-capacitor voltage balancer stage.

In one embodiment, the magnetic regulation stage further comprises: a first switch coupled between the input of the magnetic regulation stage and the first end of the inductor; and (iii) a second switch coupled between the first end of the inductor and a first voltage node in the plurality of voltage nodes of the switched-capacitor voltage balancer stage, wherein the magnetic regulation stage is capable of performing buck conversion if the second end of the inductor is conductively coupled to one of the voltage nodes of the switched-capacitor voltage balancer stage and the first and second switches are switched in a complementary fashion.

In one embodiment, the magnetic regulation stage further comprises: a third switch coupled between the first end of the inductor and a second voltage node in the plurality of voltage nodes of the switched-capacitor voltage balancer stage, wherein the second voltage node is different from the first voltage node, wherein the magnetic regulation stage is capable of performing buck conversion if the second end of the inductor is conductively coupled to one of the voltage nodes of the switched-capacitor voltage balancer stage and the first and third switches are switched in a complementary fashion.

In one embodiment, the magnetic regulation stage further comprises: a third switch coupled between the second end of the inductor and a first output of the magnetic regulation stage; and a fourth switch coupled between the second end of the inductor and a second output of the magnetic regulation stage; wherein the first output is coupled to one voltage node of the switched-capacitor voltage balancer stage and the second output is coupled to another, different voltage node of the switched-capacitor voltage balancer stage.

In one embodiment, the magnetic regulation stage further comprises at least one additional switch coupled between the second end of the inductor and an output of the magnetic regulation stage other than the first and second outputs, wherein the output of the magnetic regulation stage other than the first and second outputs is coupled to a voltage node of the switched-capacitor voltage balancer stage other than the voltage nodes coupled to the first and second outputs.

In one embodiment, the system further comprises control circuitry to control the magnetic regulation stage, the switched-capacitor voltage balancer stage, and the output switching stage, wherein the control circuitry is configured to control states of switches within the magnetic regulation stage to selectively achieve boost conversion, buck conversion or buck-boost conversion within the magnetic regulation stage.

In one embodiment, the control circuitry is configured to achieve desired voltages on the plurality of voltage nodes of the switched-capacitor voltage balancer stage, in part, by selecting one of boost or buck conversion for the magnetic regulation stage and by directly or indirectly setting switching duty cycles for transistors of the magnetic regulation stage.

In one embodiment, the magnetic regulation stage operates using current-mode control.

In one embodiment, the switched-capacitor voltage balancer stage comprises a switched-capacitor (SC) ladder circuit.

In one embodiment, the plurality of voltage nodes of the switched-capacitor voltage balancer stage are part of a capacitor stack, with each voltage node being directly coupled to at least one capacitor in the stack, wherein the plurality of voltage nodes includes a highest-voltage node at the top of the stack and a lowest-voltage node at the bottom of the stack.

In one embodiment, the switched-capacitor voltage balancer stage further comprises: first and second sets of switches, wherein the first set of switches switch on and off together in a complementary fashion with the second set of switches; and a set of transfer capacitors; wherein the transfer capacitors operate to transfer charge among the capacitors in the capacitor stack as the first and second sets of switches are switched to maintain the substantially ratiometric set of voltages on the plurality of voltage nodes.

In one embodiment, the output switching stage comprises a plurality of switch sets, each switch set having a corresponding output, wherein each switch set is configured to selectively couple a voltage from a selected one of the voltage nodes of the switched-capacitor voltage balancer stage to a corresponding output, wherein the plurality of switch sets includes at least a first switch set and a second switch set that operate independently of one another.

In accordance with another aspect of the concepts, systems, circuits, and techniques described herein, an integrated power supply and modulator system comprises: (a) a magnetic regulation stage having an input to receive an input voltage and at least one output to deliver a regulated output voltage; (b) a switched-capacitor voltage balancer stage having a plurality of voltage nodes to carry corresponding generated voltages, at least one of the plurality of voltage nodes being coupled to an output of the magnetic regulation stage, wherein the switched-capacitor voltage balancer stage is configured to maintain a substantially ratiometric set of voltages on the plurality of voltage nodes with respect to a reference potential; and (c) an output switching stage comprising a plurality of switch sets, each switch set having a corresponding output, wherein each switch set is configured to selectively couple a voltage from a selected one of the voltage nodes of the switched-capacitor voltage balancer stage to a corresponding output, wherein the plurality of switch sets includes at least a first switch set and a second switch set that operate independently of one another.

In one embodiment, the magnetic regulation stage is capable of both boost and buck regulation; and the switched-capacitor voltage balancer stage comprises a switched-capacitor (SC) ladder circuit.

In one embodiment, the magnetic regulation stage has multiple outputs, wherein each of the multiple outputs is coupled to a different voltage node in the plurality of voltage nodes of the switched-capacitor voltage balancer stage.

In one embodiment, the output of the first switch set in the plurality of switch sets is coupled to a first power amplifier and the output of the second switch set in the plurality of switch sets is coupled to a second power amplifier that is different from the first power amplifier.

In one embodiment, the output of the first switch set in the plurality of switch sets is coupled to an amplifier in one stage of a multi-stage power amplification system and the output of the second switch set in the plurality of switch sets is coupled to an amplifier in a different stage of the multi-stage power amplification system.

In one embodiment, the output of the first switch set in the plurality of switch sets is coupled to an amplifier driving a first transmit antenna in a multiple input, multiple output (MIMO) enabled wireless transmitter and the output of the second switch set in the plurality of switch sets is coupled to an amplifier driving a second, different transmit antenna in the MIMO enabled wireless transmitter.

In one embodiment, the output of the first switch set in the plurality of switch sets is coupled to an amplifier driving a first transmit antenna in a wireless transmitter that supports transmit diversity and the output of the second switch set in the plurality of switch sets is coupled to an amplifier driving a second, different transmit antenna in the wireless transmitter that supports transmit diversity.

In one embodiment, the output of the first switch set in the plurality of switch sets is coupled to a power amplifier operative within a first frequency range and the output of the second switch set in the plurality of switch sets is coupled to a power amplifier operative within a second, different frequency range.

In one embodiment, the system further comprises at least one filter coupled to the output of at least one of the plurality of switch sets of the output switching stage to provide filtration to a corresponding voltage signal.

In one embodiment, the magnetic regulation stage further comprises: an inductor having a first end and a second end; a first switch coupled between the input of the magnetic regulation stage and the first end of the inductor; a second switch coupled between the first end of the inductor and a first voltage node in the plurality of voltage nodes of the switched-capacitor voltage balancer stage; a third switch coupled between the second end of the inductor and a first output of the magnetic regulation stage; and a fourth switch coupled between the second end of the inductor and a second output of the magnetic regulation stage, wherein the first output of the magnetic regulation stage is coupled to one voltage node of the switched-capacitor voltage balancer stage and the second output of the magnetic regulation stage is coupled to another, different voltage node of the switched-capacitor voltage balancer stage.

BRIEF DESCRIPTION OF THE DRAWINGS

The foregoing and other objects, features and advantages of the concepts, systems and techniques described herein will be apparent from the following description of particular embodiments, as illustrated in the accompanying drawings in which like reference characters refer to the same elements throughout the different views. The drawings are not necessarily to scale, emphasis instead being placed upon illustrating the principles of the concepts, systems, circuits and techniques for which protection is sought.

DETAILED DESCRIPTION

Figure 1:
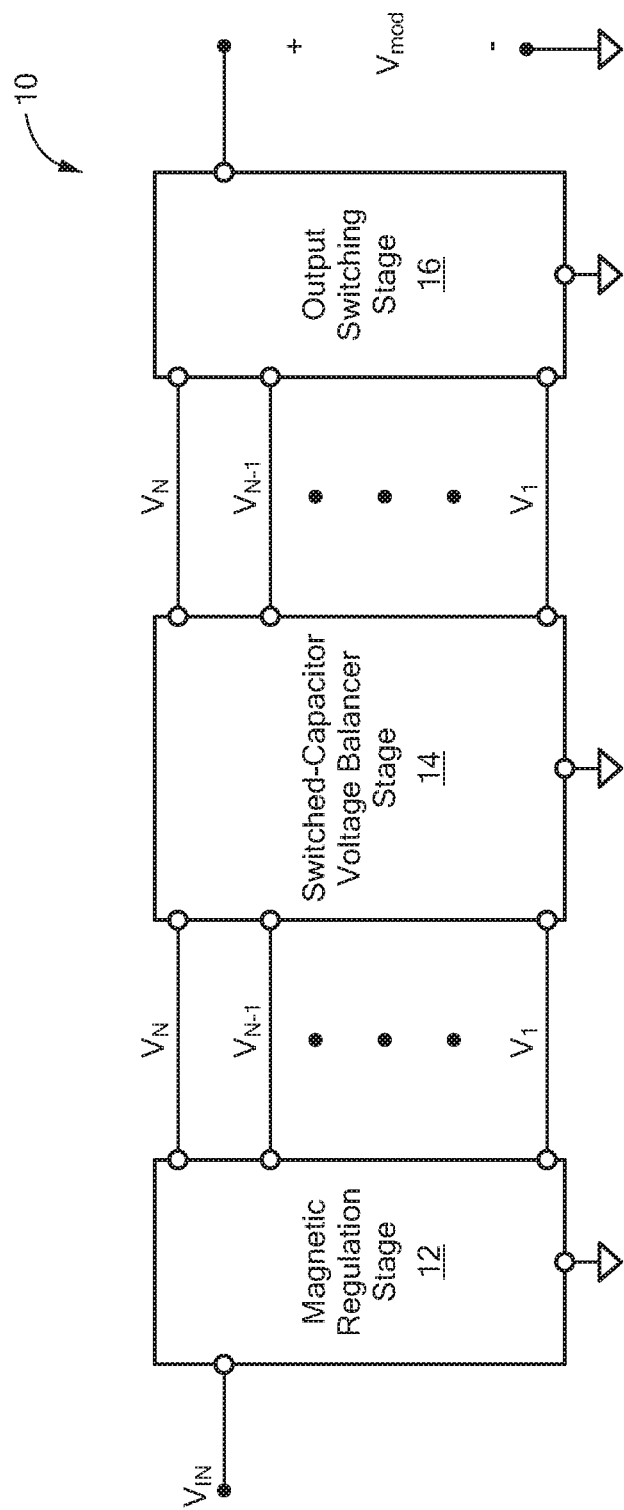
FIG. 1 is block diagram of an integrated power supply and modulator system.

Referring now to FIG. 1, an integrated power supply and modulator system 10 includes three subsystems: (1) a switched-capacitor (SC) voltage balancer stage 14; (2) a magnetic regulation stage 12; and (3) at least one output switching stage 16. It should be appreciated that aspects of the structure and function of these subsystems can be merged. However, the three subsystems are separately described hereinbelow to promote clarity in the written description of the drawing figures as well as clarity in the description of the broad concepts sought to be protected herein. As described above, the magnetic regulation stage 12 regulates the voltage while the SC voltage balancer stage maintains desired voltage ratios. As noted above, however, the three systems may also be thought of as being partially or even fully merged and thus an integrated power supply and modulation system provided in accordance with the concepts, systems, circuits and techniques described herein may be considered as being provided from a single subsystem, two subsystems, or more than three subsystems.

The SC voltage balancer stage 14 regulates relative voltages on a set of capacitors, such that the voltages across the set of capacitors maintain a desired ratiometric relationship and/or that capacitor terminal voltages with respect to a common potential maintain a desired ratiometric relationship. These capacitor terminal voltages represent, for example, a set of discrete supply voltages utilized for supply switching. The SC voltage balancer may maintain ratiometric voltages (including identical voltages) across the set of capacitors. The SC voltage balancer 14 may alternatively, or in addition, act as a multi-output switched capacitor converter, maintaining a ratiometric set of voltages between individual capacitor terminals and a reference potential. Energy is provided into SC voltage balancer stage 14 via the magnetic regulation stage 12 and is delivered to a power amplifier (not shown in FIG. 1) via the output switching stage 16. The magnetic regulation stage 12 may provide energy and charge into one, two, or more than two ports of the SC voltage balancer stage 14.

Exemplary magnetic regulation stages, SC voltage balancer stages, and output switching stages are described herein below. Those of ordinary skill in the art will appreciate, of course, that the exemplary magnetic regulation stages, SC voltage balancer stages, and output switching stages may be implemented using any one of a large variety of different specific circuit implementations and techniques. Thus, the descriptions of such stages provided hereinbelow are not intended to be, and should not be construed as, limiting.

Figures 2A, 2B:
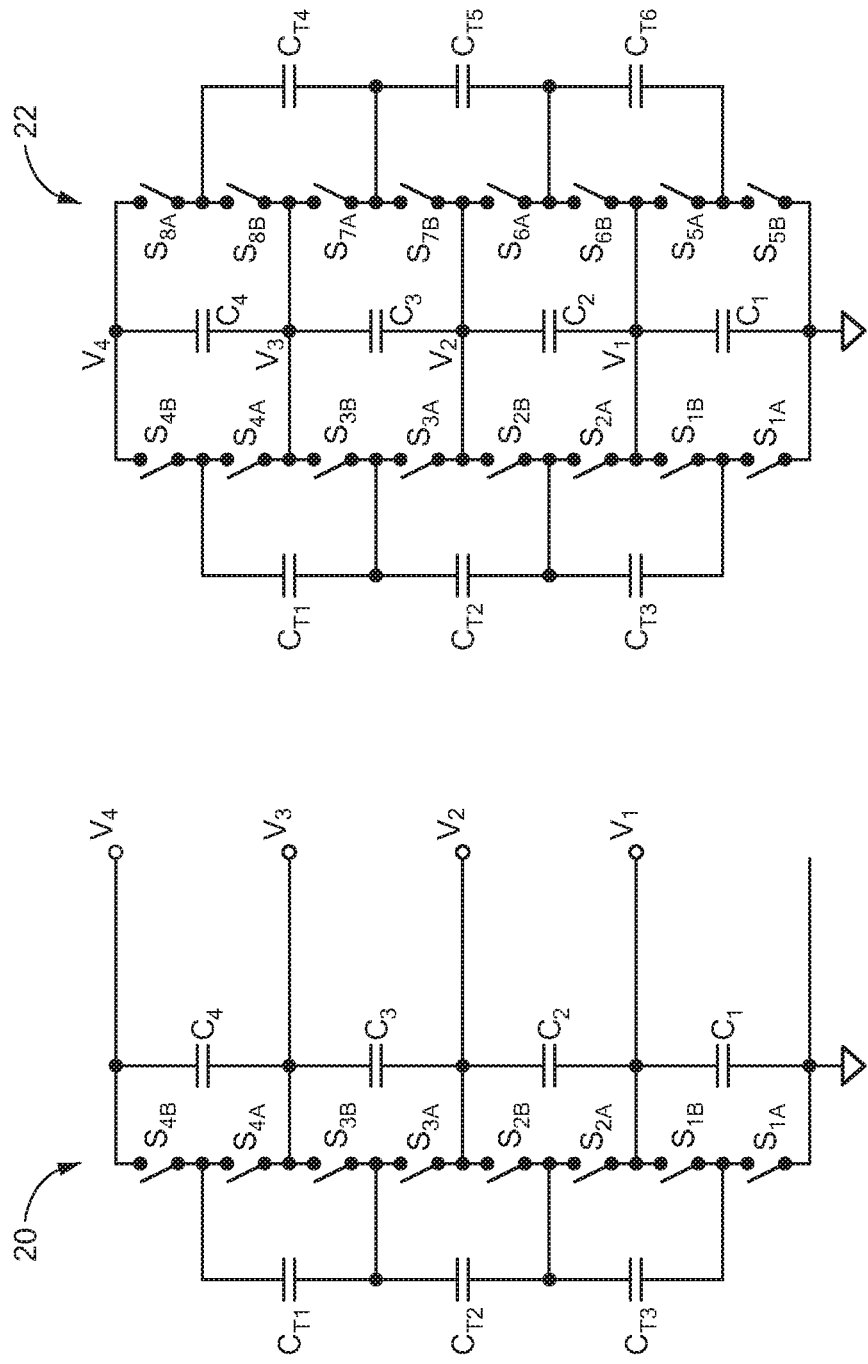
FIG. 2A is a schematic diagram illustrating a circuit topology for a switched-capacitor (SC) voltage balancer circuit.
FIG. 2B is a schematic diagram illustrating a circuit topology for an alternate embodiment of an SC voltage balancer circuit.

Referring now to FIG. 2A, an exemplary SC voltage balancer stage 20 of a type which may be suitable for use in the integrated power supply and modulator system 10 of FIG. 1, includes an SC ladder circuit. The exemplary SC voltage balancer stage of FIG. 2A illustrates one possible implementation of an SC voltage balancer stage for a case with 4 voltage levels. It should, of course, be appreciated that any number of voltage levels may be used. The circuit is based upon an SC ladder circuit which may be similar to the type described in M. Seeman and S. Sanders, "Analysis and Optimization of Switched-Capacitor DC-DC Converters", *IEEE Transactions on Power Electronics*, March 2008 vol. 23, no. 2. However, unlike the aforementioned example, in the present system, energy and charge are input into the stage at multiple terminals and drawn from the stage at multiple terminals. The circuit maintains approximately equal voltages across capacitors $C_1$, $C_2$, $C_3$ and $C_4$, and maintains approximate ratiometric relationships among voltages $V_1$, $V_2$, $V_3$, $V_4$ (with respect to common) of $V_1:V_2:V_3:V_4$ of 1:2:3:4, with charge introduced to and/or drawn from the voltage balancer at nodes labeled $V_1$, $V_2$, $V_3$, $V_4$.

Voltages $V_1$, $V_2$, $V_3$, $V_4$ correspond to discrete supply voltage levels provided by an SC voltage balancer stage (e.g., SC voltage balancer stage 14 in FIG. 1) to an output switching stage (e.g. output switching stage 16 in FIG. 1), with charge introduced to the voltage balancer by a magnetic regulation stage (e.g., magnetic regulation stage 12 in FIG. 1) via at least one of the terminals associated with $V_1$, $V_2$, $V_3$, $V_4$, and preferentially at two or more of these terminals, as described hereinbelow. Switches $S_{1A}$, $S_{2A}$, $S_{3A}$, $S_{4A}$ switch on and off together in a complementary fashion with switches $S_{1B}$, $S_{2B}$, $S_{3B}$, $S_{4B}$. The transfer capacitors $C_{T1}$, $C_{T2}$ and $C_{T3}$ transfer charge among capacitors $C_1$, $C_2$, $C_3$ and $C_4$ such that the voltage ratios $V_1:V_2:V_3:V_4$ are maintained approximately as 1:2:3:4. It will be appreciated that this SC balancer stage topology could be employed to provide a subset of these voltages, and other SC balancer topologies or multi-output switched-capacitor converter topologies could be employed providing different ratiometric relations. For example, a balancer providing 8:4:2:1 could be realized with appropriate circuit structures. The exemplary SC voltage balancer stage circuit topology of FIG. 2A is of particular advantage for CMOS implementation for a number of different reasons including, but not limited to: (1) the individual (switch) device and capacitor voltages are individually maintained as small voltages (i.e., of scale $V_1$ as compared to the larger maximum synthesized voltage $V_4$), enabling high switching speed, small die size, and high energy density; (2) control and level-shifting circuitry required in this exemplary implementation are simpler, require lower complexity and die area and are more easily implemented than in other circuits and can be easily implemented on the same CMOS die; and (3) the implementation requires a number of off-die connections which is relatively small compared with the number of off-die connections required in prior art approaches, principally at nodes connecting to $C_1$-$C_4$ and $C_{T1}$-$C_{T3}$. The circuit is designed/constructed in such way that no flying drivers are required for the switches. In addition, all the control and level-shifting circuitries are referenced to fixed potentials. All these advantages make the control and level-shifting circuitry simpler.

It will, of course, be appreciated that there are other variants with similar advantages. For example, as illustrated in FIG. 2B, by adding an additional set of transfer capacitors $C_{T4}$-$C_{T6}$ and switches $S_{5A}$-$S_{8A}$ (operated in-phase with switches $S_{1A}$-$S_{4A}$ and out-of-phase with switches $S_{1B}$-$S_{4B}$) and switches $S_{5B}$-$S_{8B}$ (operated in-phase with switches $S_{1B}$-$S_{4B}$ and out-of-phase with switches $S_{1A}$-$S_{4A}$), the two sets of transfer capacitors ($C_{T1}$-$C_{T3}$ and $C_{T4}$-$C_{T6}$) operate with their respective sets of connections to the capacitor stack of $C_1$-$C_4$ made in a complementary fashion. In this manner, one can implement an interleaved switched capacitor voltage balancer stage 22. Such an implementation includes a greater number of components and die interconnects than the embodiment of FIG. 2A. On the other hand, the interleaved switched capacitor voltage balancer stage approach reduces the required capacitor volume, along with reducing switching ripple and loss. The interleaved switched capacitor voltage balancer stage approach could also enable partial or complete "soft charging" of some or all of the capacitors in the switched-capacitor voltage balancer stage by the output switching stage and load, thereby improving the tradeoff between switching frequency and loss characteristics.

Likewise, the implementations of FIGS. 2A and 2B could utilize resonant switched-capacitor operation with the addition of properly sized inductors in series with the energy transfer capacitors. It will be appreciated that while the topologies of FIGS. 2A and 2B provide at least the above-noted particular advantages, other switched-capacitor topologies could also be employed.

The output switching stage 16 (FIG. 1) dynamically selects from among one or more of the capacitor voltages (e.g., $V_1$-$V_4$ in FIG. 2A). The switching network for doing so can be implemented in a number of ways.

Figure 3B:
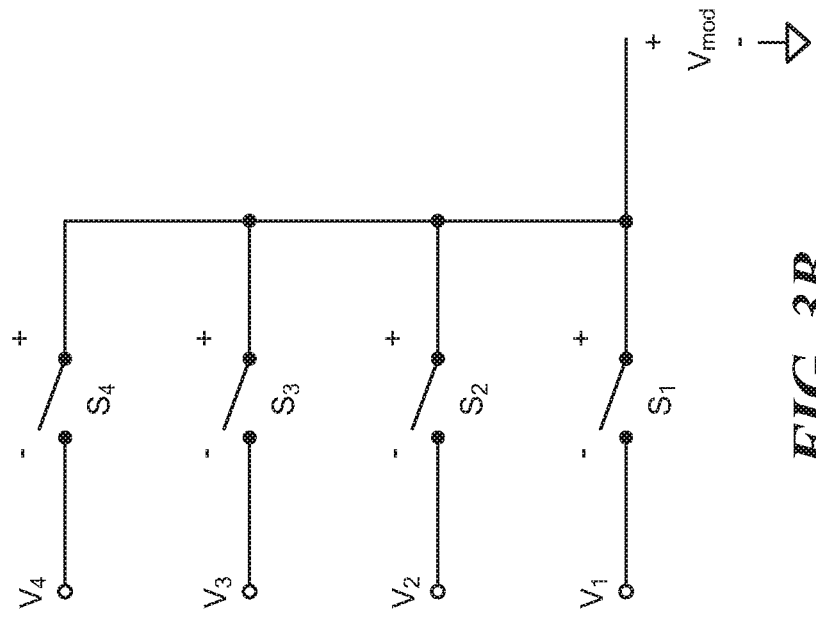
FIG. 3B is a schematic diagram of another exemplary embodiment of a switching network for an output switching stage.
Figure 3A:
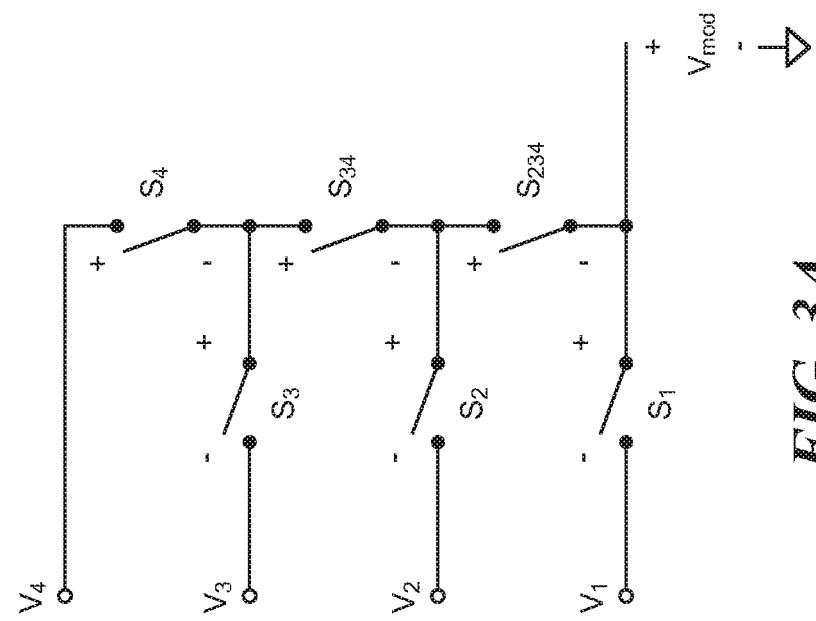
FIG. 3A is a schematic diagram of an exemplary embodiment of a switching network for an output switching stage.

FIGS. 3A and 3B, for example, illustrate a basic structure of two exemplary switching networks that can be applied for this function. Versions of each of these two approaches are described in J. L. Dawson, D. J. Perreault, E. W. Huang, S. Chung, and P. A. Godoy, "Asymmetric Multilevel Outphasing Architecture for RF Amplifiers," U.S. Pat. No. 8,026,763 B2, Sep. 27, 2011. It should be appreciated that while the basic structures shown in FIGS. 3A and 3B are similar to those previously disclosed, particular implementations and driving methods are described herein (e.g., in conjunction with FIGS. 4A, 4B, 5, 12A and 12B) that differ from what has been previously disclosed in terms of how the switch networks are implemented and how they are driven.

Considering a base voltage $V_1$ as being 1 per unit (p.u.), with higher voltages $V_2$-$V_4$ related ratiometrically as described previously, switch voltage blocking requirements may be identified as follows: In FIG. 3A, $S_4$, $S_{34}$, $S_{234}$, and $S_3$ each must block +1 p.u. voltage, while $S_2$ blocks +2 p.u. voltage and $S_1$ blocks +3 p.u. voltage. In FIG. 3B, switch $S_1$ must block +3 p.u., $S_2$ must block both +2 p.u, and −1 p.u. voltage, $S_3$ must block +1 and −2 p.u, voltage, and $S_4$ must block −3 p.u. voltage.

Factors for achieving improvements in the switching stage as compared to direct implementations of FIGS. 3A and 3B include, but are not limited to: (1) realizing the level shifting and drive functions in manners that avoid the need for "flying" switch drivers or level shifters and avoiding the need for external gate drive "bootstrap" capacitors; and/or (2) realizing the switch functions (or switches) in a manner that enables fast, efficient switching, and especially in a manner that can be directly realized in low-voltage integrated processes.

Figure 4A:
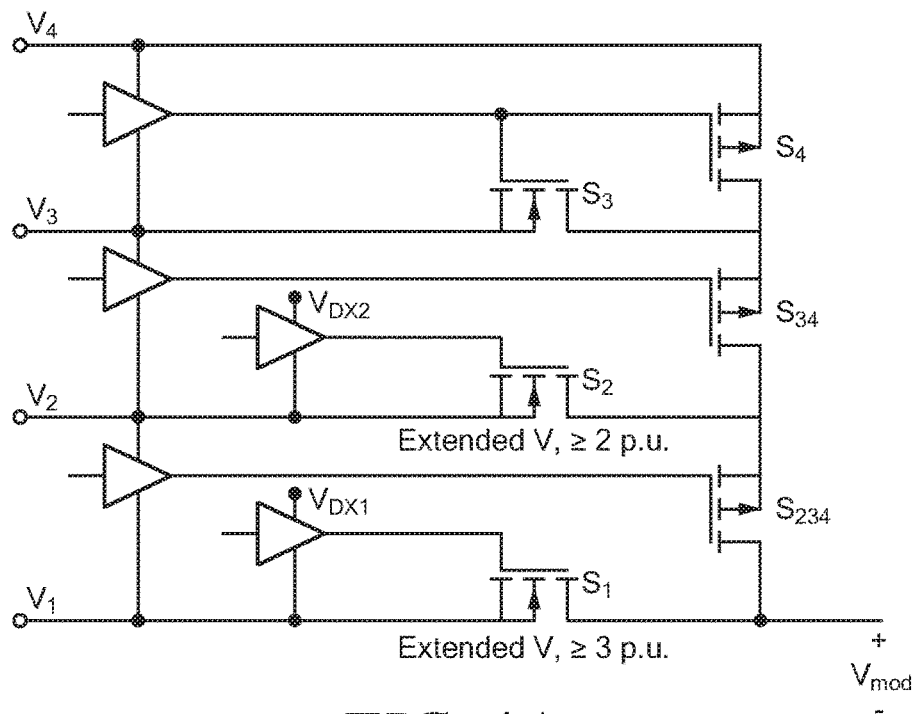
FIG. 4A is a schematic diagram of an exemplary embodiment of an output switching stage which includes extended voltage devices.

Referring now to FIG. 4A, one embodiment of a circuit to implement the function described above in conjunction with FIG. 3A in a manner that requires no flying drivers or external "bootstrap" capacitors includes a plurality of driver circuits (or more simply "drivers") at least some of which are coupled to extended voltage devices. This improves switching frequency capability, reduces the need for off-die interconnections (e.g., to bootstrap capacitors), and simplifies signal level-shifting circuits for control. Some of the switches are implemented using low-voltage "core" CMOS devices (NMOS or PMOS), enabling particularly low-loss switching, while others are "extended voltage" devices (e.g., requiring greater than 1 p.u. voltage rating).

As shown in FIG. 4A, some of the switches are indicated to have extended voltage ratings as compared to other switches rated for a base value of at least 1 p.u. The drivers for these extended voltage devices are not "flying." The drive voltage required (e.g., as illustrated for the drivers) will depend on the particular semiconductor process being used (e.g., $V_{DX2}$ may be tied to $V_3$ or $V_4$ and $V_{DX1}$ may be tied to $V_2$, $V_3$, or $V_4$ depending upon process requirements). For example, depending upon the particular process, the gate voltage may need to be switched to a different voltage potential to have large enough gate-source voltages to obtain sufficiently low on-resistance. It will likewise be appreciated that the exact voltage levels used for various drivers may be adjusted depending upon process requirements. A key feature in these embodiments is that flying drivers and bootstrap capacitors are not required.

Figure 4B:
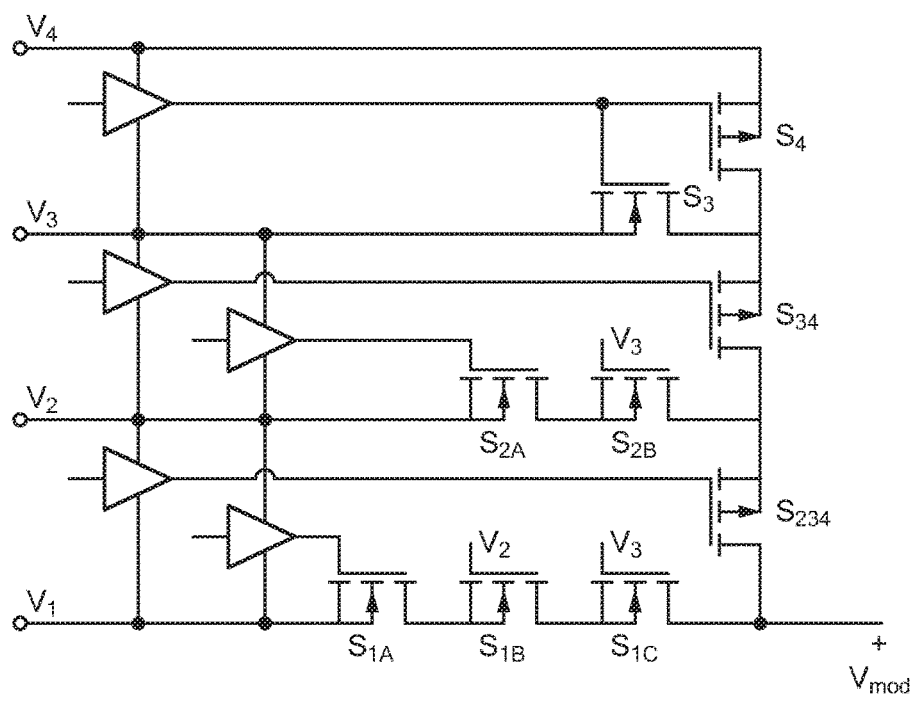
FIG. 4B is a schematic diagram of an exemplary embodiment of an output switching stage which does not include extended voltage devices.

In some applications, it may be desired to realize the output switching stage without needing extended voltage devices. This can be accomplished, for example, by using cascode switch structures in place of one or more of the extended-voltage switches. FIG. 4B is a schematic diagram illustrating an output switching stage that includes cascode structures in accordance with an embodiment. Implementing such structures requires careful attention to the device sizes and capacitances of the cascoded device sets (e.g., $S_{2A}/S_{2B}$ and $S_{1A}/S_{1B}/S_{1C}$). The devices sizes and capacitances can be selected to provide voltage sharing among the devices in the off state. It will be further appreciated that the use of cascode switches and extended voltage switches can be combined (e.g., resulting in hybrids of the circuits of FIGS. 4A and 4B).

Figure 5:
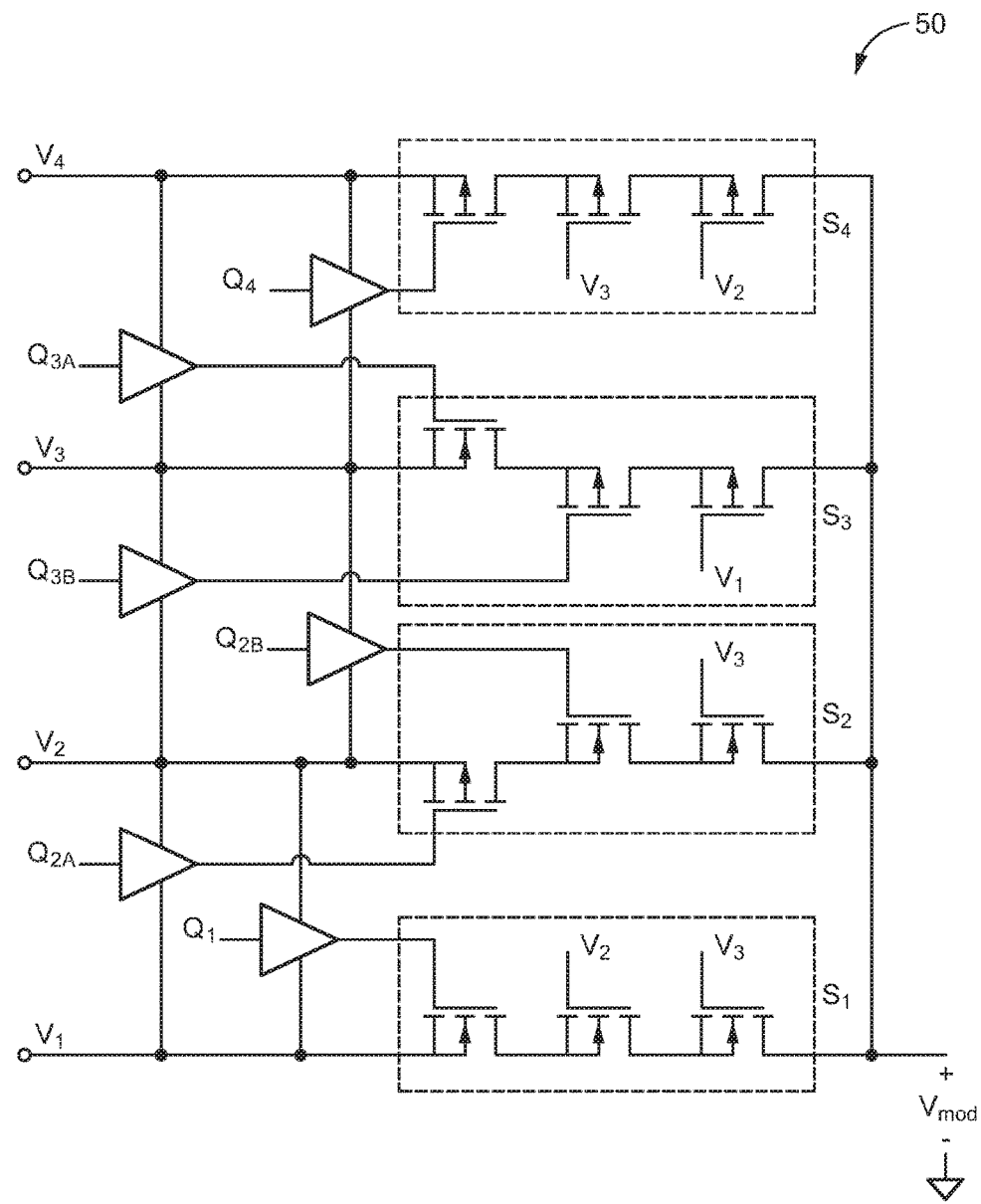
FIG. 5 is a schematic diagram of an exemplary embodiment of an output switching stage implemented using low-voltage complementary metal oxide semiconductor (CMOS) devices.

Referring now to FIG. 5, a circuit 50 includes a plurality of drivers $Q_1$-$Q_4$ coupled to switches $S_1$-$S_4$ (with switches indicated by the dashed boxes). Each of switches $S_1$-$S_4$ includes a plurality of switching devices FET1-FET3 with at least one of devices FET1-FET3 in each switch being coupled to an output of a driver. Circuit 60 illustrates how the switch architecture of FIG. 3B can be realized using only low-voltage CMOS devices (through cascoded structures) and without requiring flying drivers or off-chip connections for bootstrap capacitors. Given devices each having a 1 p.u. voltage rating, the combined elements provide switching with voltage blocking as follows: switch $S_1$ blocks +3 p.u., switch $S_2$ blocks both +2 p.u./−1 p.u., switch $S_3$ blocks +1 p.u./−2 p.u., and switch $S_4$ blocks −3 p.u. As each of the individual devices forming the switching elements only need to have drain-source ratings of 1 p.u., in many CMOS processes they could be implemented with fast core devices. As described above, the individual devices in a cascode stack may be sized (or provided with additional capacitance) to yield acceptable voltage sharing in the off state. It will also be appreciated that some or all of the cascode stacks could be replaced with higher voltage devices (having ratings of more than 1 p.u. as needed). Table 1 below shows the driver switching used to generate the desired output switching (i.e., Table 1 shows driver output states needed to achieve different modulator output voltages).

It should be appreciated that other implementations of the output switch stage network consistent with the concepts, systems, circuits and techniques described herein may be similarly realized.

Figure 6:
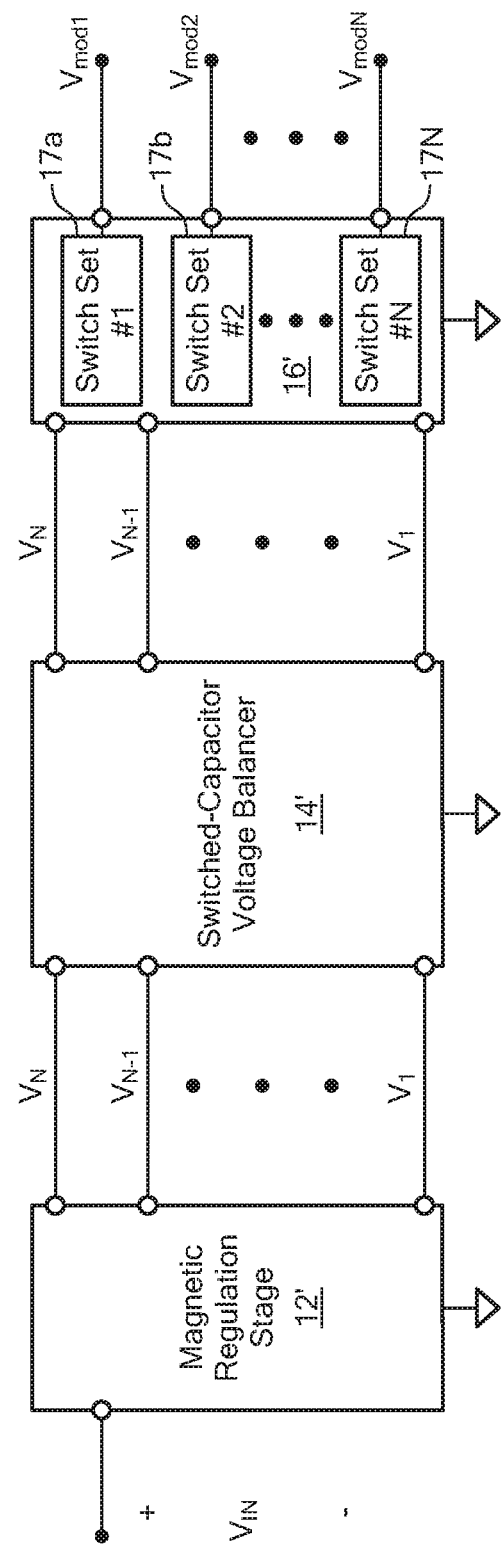
FIG. 6 is a block diagram of an exemplary integrated power supply and modulator system including an output switching stage comprising a plurality of switching stages (or a switching stage with a plurality of switch sets) to supply different amplifiers and/or modulate voltages of different amplifier stages in a multi-stage amplifier and/or to be used to drive the same amplifier under different conditions.

FIG. 6 is a block diagram illustrating an exemplary integrated power supply and modulator system 10' that may be similar to the system 10 of FIG. 1. As shown, the system 10' includes three subsystems: (1) a switched-capacitor (SC) voltage balancer stage 14'; (2) a magnetic regulation stage 12'; and (3) at least one output switching stage 16' which includes a plurality of switch sets 17a-17N. Thus, integrated power supply and modulator system 10' is capable of supplying different amplifiers and/or modulating the voltage of different amplifier stages in a multi-stage amplifier and/or being used to drive a single power amplifier for different operating conditions.

An integrated power supply and modulator system such as integrated power supply and modulator system 10' finds application in systems having a plurality of power amplifiers. That is, in systems having a plurality of power amplifiers, an integrated power supply and modulator system may include a plurality of output switching stages or a single output switching stage having a plurality of switch sets (or a combination of the two configurations) to supply different amplifiers and/or modulate the voltage of different amplifier stages in a multi-stage amplifier and/or driving a single power amplifier under different conditions.

Such a system may find use, for example, when addressing power amplifier systems supporting LTE-Advanced Carrier Aggregation and transmit diversity (either on the base station or user equipment side) where multiple PA's are transmitting at the same time, such simultaneous operation of multiple output switching stages for these different transmitting PA's and stages would be enabled. When modulating smaller size PA driver stages, the output switching stages can be differently sized and optimized taking into account lower transmitted power requirements by the driver stages.

TABLE 1

| $V_{mod}$ | $Q_1$ | $Q_{2A}$ | $Q_{2B}$ | $Q_{3A}$ | $Q_{3B}$ | $Q_4$ |
|---|---|---|---|---|---|---|
| $V_1$ | H | H | X | X | H | H |
| $V_2$ | L | L | H | X | H | H |
| $V_3$ | L | X | L | H | L | H |
| $V_4$ | L | X | L | L | X | L |

In some applications, the output switching state voltage $V_{mod}$ may be applied directly to a power amplifier. However, in some applications, further processing of this voltage may be desired. This may include, for example, additional linear regulation and/or amplification to provide continuous output voltage control or to control the transitions between levels. Linear regulation or amplification circuitry (e.g., a pass transistor and controls) may optionally be placed on the same die with the rest of the power supply and modulator system.

Figure 7:
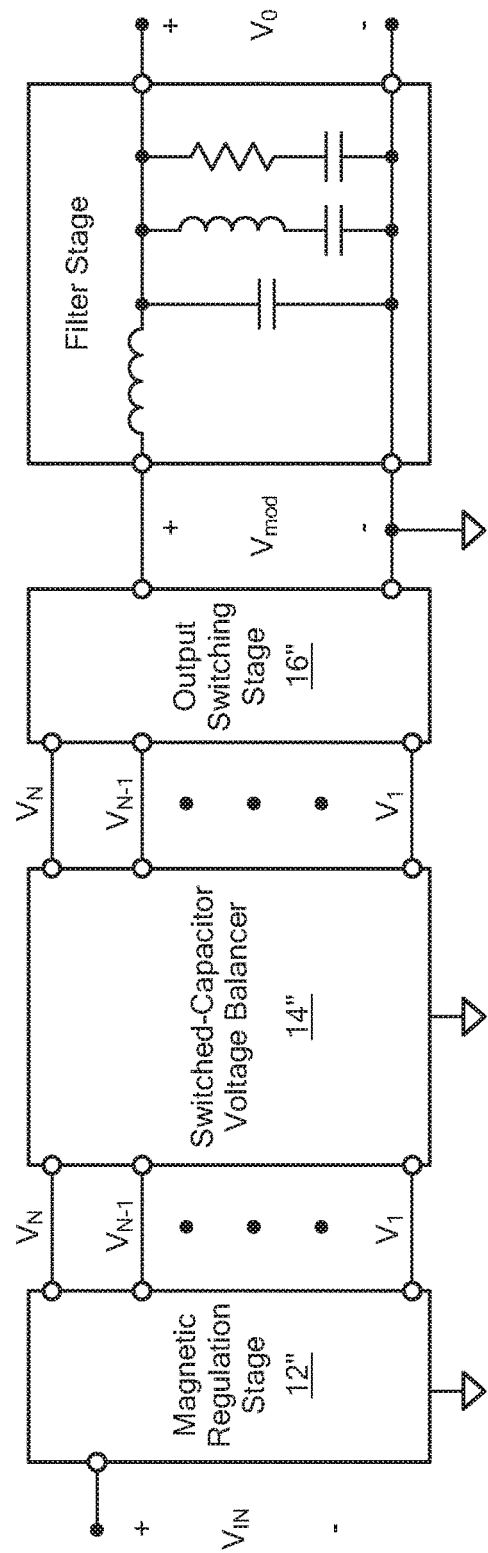
FIG. 7 is a block diagram of an exemplary integrated power supply and modulator system having an output filter stage.

Referring now to FIG. 7, instead of or in addition to additional linear regulation and/or amplification, one may provide additional filtering of the voltage $V_{mod}$ through an added filtering stage. It will be appreciated that a wide variety of filter types might be employed to meet the needs of, for example, output waveform frequency content, receive-band noise suppression, and/or other requirements. To achieve continuous output voltage control (e.g., for envelope tracking), one can modulate among levels at a fast rate and use the filter stage to filter this waveform to provide the desired average voltage. Alternatively, an added filtering stage can be used to shape transitions among switching levels such that the output voltage has only desired frequency content.

The magnetic regulation stage 12 regulates the switched-capacitor voltage balancer outputs while the distribution of the conversion ratios are maintained by the balancer. With this feature, the output power of a PA can be scaled down continuously while maintaining high efficiency (e.g., to provide efficient backoff over a wide average power range). In addition, the output (or set of ratiometric outputs) can be held to a desired level as the input supply voltage varies (e.g., to reduce the effects of battery voltage variation/discharge on operating range of the PA).

One conventional approach would be to cascade a magnetic converter (providing regulation) with an SC stage (to generate multiple levels). For such a case with a boost-topology magnetic converter feeding the top voltage of the SC stage, and inductor current ripple $\Delta I$ in the boost inductor, the inductance needs to be $V_{IN}/\Delta I * ((V_{OUT}-V_{IN})/V_{OUT})/f_{sw}$ with given switching frequency $f_{sw}$ and input and output voltages, $V_{IN}$ and $V_{OUT}$ (or $V_4$ in the 4-level SC voltage balancer). For slow switching frequencies and/or large difference between input and output voltages, the required inductor size could be large.

Figure 8:
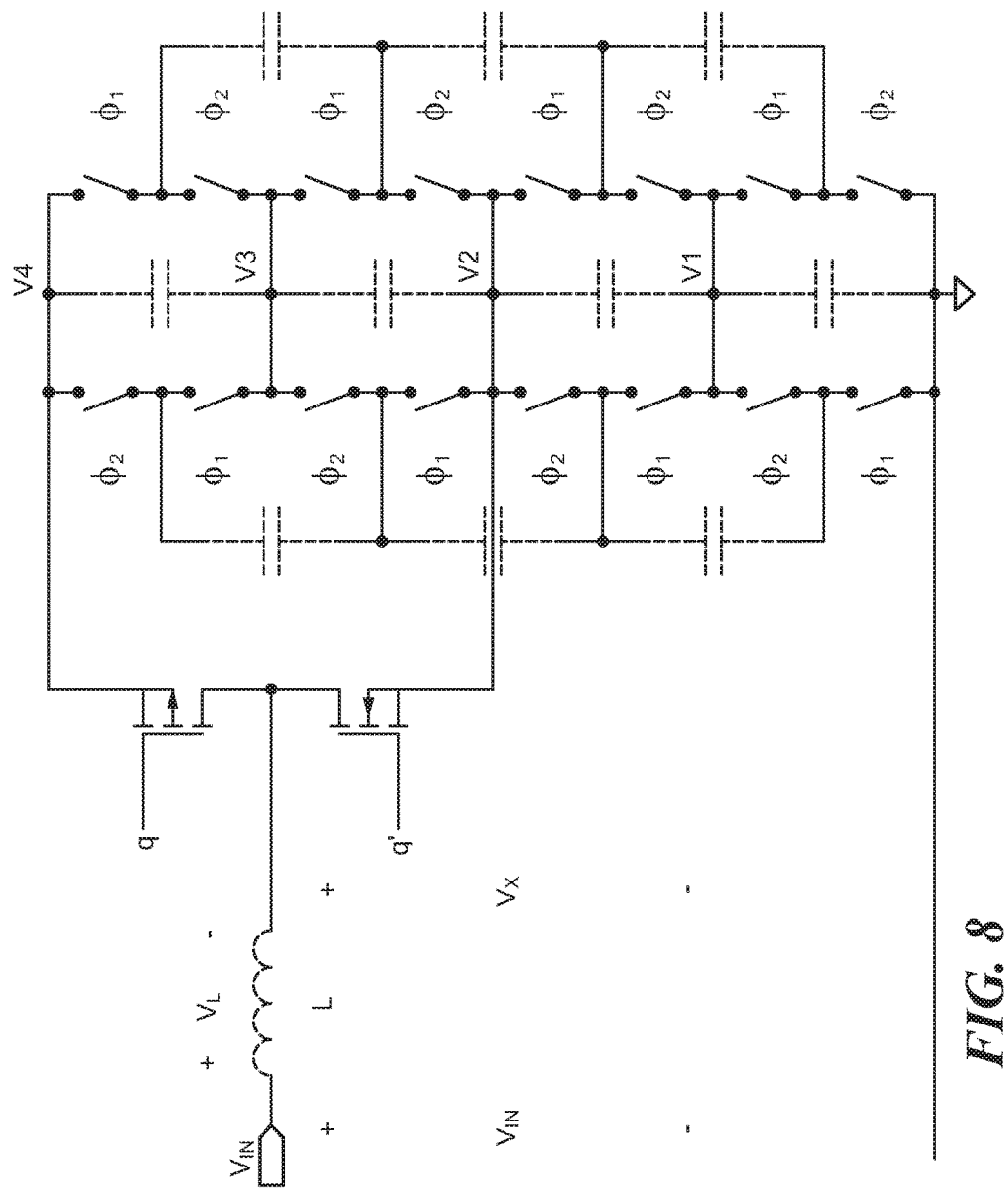
FIG. 8 is a schematic diagram of an exemplary magnetic regulation stage cascading into a four-level interleaved SC voltage balancer stage.

To overcome this drawback, an approach such as that described in FIG. 8 may be used, in which the magnetic regulation stage supplies charge to more than one of the SC stage nodes over a switching cycle.

Referring now to FIG. 8, shown is an exemplary magnetic regulation stage cascading into an N-level interleaved SC voltage balancer stage. To promote clarity in the description, the N-level interleaved SC voltage balancer stage is illustrated as a 4-level interleaved SC voltage balancer stage in FIG. 8. Instead of switching the boost inductor output terminal between the input of the SC voltage balancer and ground (as would be done with a boost converter), the boost inductor is switched between the intermediate voltage levels in the SC voltage balancer stage. In the exemplary embodiment of the circuit in FIG. 8, the inductor terminal is switched between $V_2$ and $V_4$ (or $V_{OUT}$) in the SC voltage balancer, but it can be connected among any levels in general. Operation in this manner is possible owing to the action of the SC voltage balancer to appropriately redistribute charge among the various levels, maintaining the desired voltage ratios.

Regulation of the SC voltage balancer voltages can be obtained by pulse width modulation (PWM) control of the regulation stage. With the configuration in FIG. 8, the output voltage V4 is $2V_{IN}/(1+D)$ in steady state (D is the duty ratio for q). So the steady state value of $V_4$ can be adjusted from $V_{IN}$ to $2V_{IN}$. With this configuration, for inductor current ripple $\Delta I$, the required inductance is $(V_{IN}-V_2)/\Delta I*((V_{OUT}-V_{IN})/(V_{OUT}-V_2))/f_{sw}$. With $V_2=V_{OUT}/2$, the required inductance in the proposed configuration is only $(2V_{IN}-V_{OUT})/V_{IN}$ of the required inductance in the conventional design ($V_{OUT}>V_{IN}$). This advantage in inductor value and size can become greater for higher-level SC voltage balancers (e.g., more levels).

Moreover, the switches in the regulation stage are only required to block the difference in intermediate voltages levels used for switching. Thus, for example, the regulator switches in FIG. 8 must block 2 p.u. voltage (the difference between $V_4$ and $V_2$ in the SC voltage balancer) instead of the full output voltage of the SC stage (4 p.u., or the difference between V4 and ground) as would be needed in a boost converter. Switches with lower voltage ratings can be used to achieve faster switching speed and better performance.

To leverage the benefits of low voltage device in CMOS technology, cascoded devices can be implemented in the regulation stage.

Figure 9:
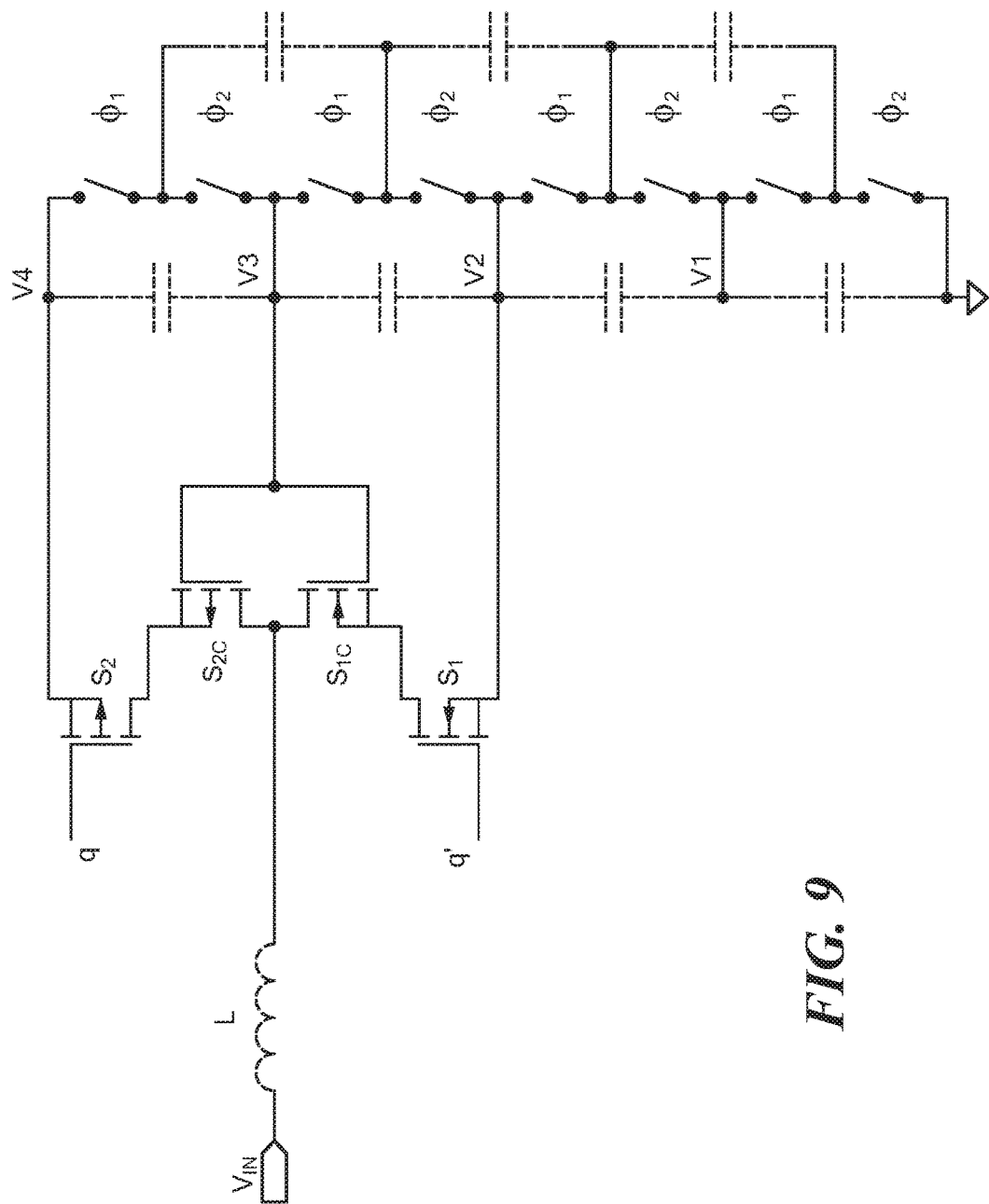
FIG. 9 is a schematic diagram of an exemplary magnetic regulation stage provided with a switching network having cascoded devices.

FIG. 9 illustrates an exemplary cascoded device configuration for realizing the switches in the regulation stage. The gates of the cascoded device $S_{1C}$ and $S_{2C}$ are connected to the dc level $V_3$ in the SC voltage balancer. When the switch $S_1$ is turned on, the drain of $S_1$ (or source of $S_{1C}$) discharges low enough until the gate source voltage of the cascoded device $S_{1C}$ is greater than the threshold voltage, $S_{1C}$ will be turned on. During the turn-off cycle, the drain of $S_1$ (or source of $S_{1C}$) charges until the gate source voltage of the cascoded device $S_{1C}$ is smaller than the threshold voltage and $S_{1C}$ will be turned off. The cascoded device $S_{2C}$ operates the same as device $S_{1C}$. In the cascaded device implementation, each device is only required to block half of the total blocking voltage, and hence devices with lower voltage ratings can be used. Moreover, it will be appreciated that with this implementation and the implementation of FIG. 8, flying drivers and bootstrap capacitors are not required for driving the switches.

In general, when the output of the regulation stage is connected between the $m_{th}$ level and the $n_{th}$ level of a k-level SC converter, the voltage of the top level ($k_{th}$ level) can be regulated as in equation (1):

$$V_k = \frac{V_{IN} \cdot k}{n + (m-n)D} \qquad (1)$$

where D is the duty of the switch q (i.e., the top switch). It is noted that the switching frequency of the regulation stage can be different from that of the SC voltage balancer stage and each of these can be different from the switching frequency of the output switching stage.

Figure 10:
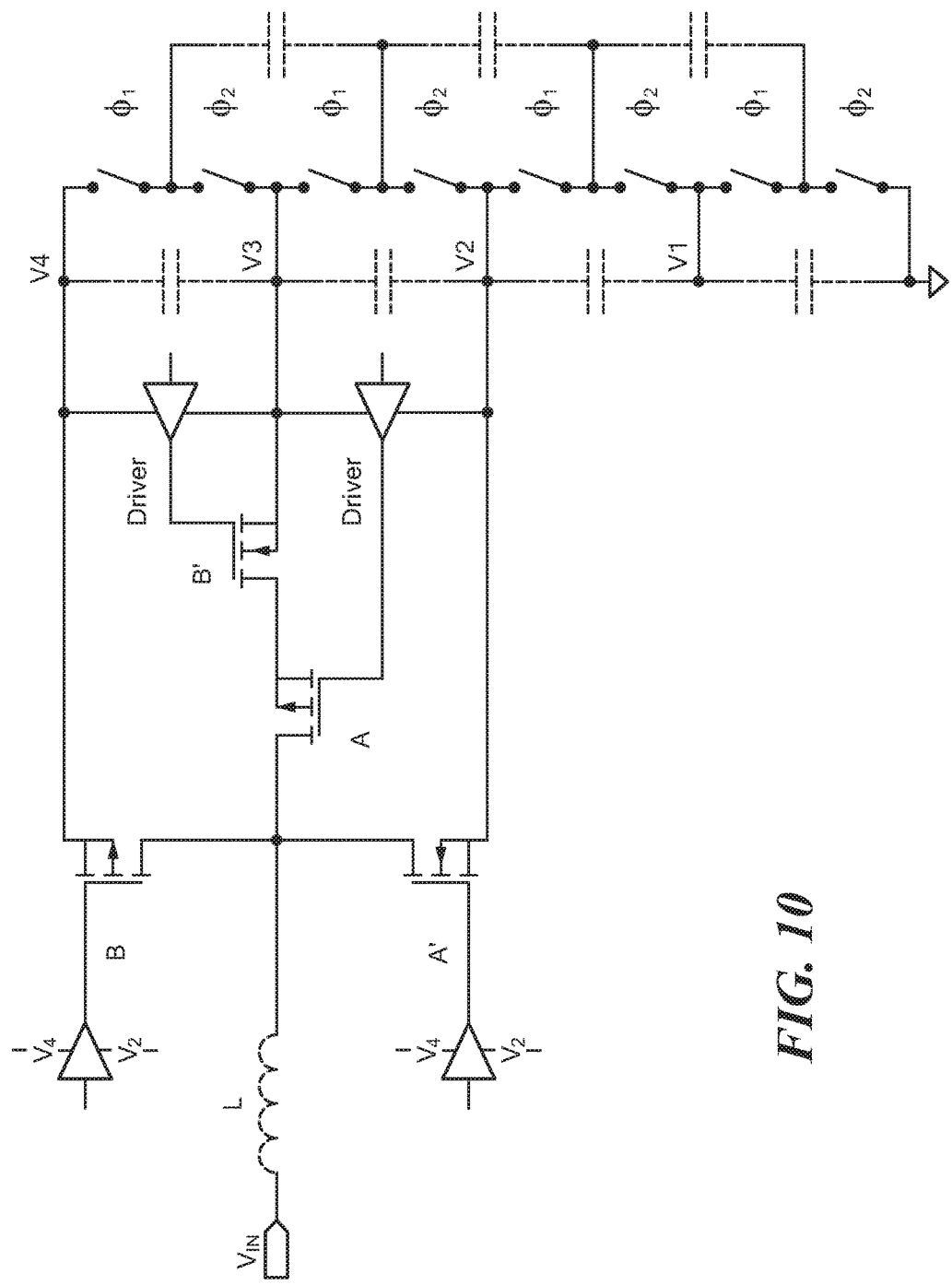
FIG. 10 is a schematic diagram of an exemplary multi-level magnetic regulation stage.

Referring now to FIG. 10, a multi-level regulation stage is coupled to an SC voltage balancer. In this configuration, the output of the regulation stage is connected among up to three intermediate levels of the SC voltage balancer. In this case, the voltage swing across inductor L is further reduced, consequently reducing the required inductance for a given current ripple ΔI. No flying driver is required in this design; all the drivers are referenced between dc levels $V_4$, $V_3$ and $V_2$. When B' is held on (high), A and A' can be modulated and the output terminal of the inductor switches between $V_3$ and $V_2$ (delivering charge to those nodes, and regulating the voltage according to equation (1)). When A is held on (low), B and B' can be modulated and the output terminal of the inductor switches between $V_4$ and $V_3$ (again regulating the voltage according to equation (1)).

It will be appreciated that in general, with appropriate switch implementations, the output terminal of the inductor can be switched among any of the SC voltage levels that are desired (as well as ground, if desired). Generally, increasing the numbers of levels that can be switched among increases the achievable regulation range, and helps improve inductor size and ripple that is required. Such operation is possible because the SC stage redistributes charge among the levels to maintain the ratiometric relation between capacitor voltages.

It will also be appreciated that continuous switching need not always be used. That is, one can hold the output terminal of the inductor at a specific level. This will not provide continuous regulation, but will enable the highest efficiency of energy transfer owing to the elimination of switching and gating loss in the regulation stage. It will be further appreciated that additional control means can be used for regulation, including burst-mode or on/off control, current-mode control, hysteresis control, pulse-skipping control, single or multi-level sigma-delta control, etc.

Figure 11:
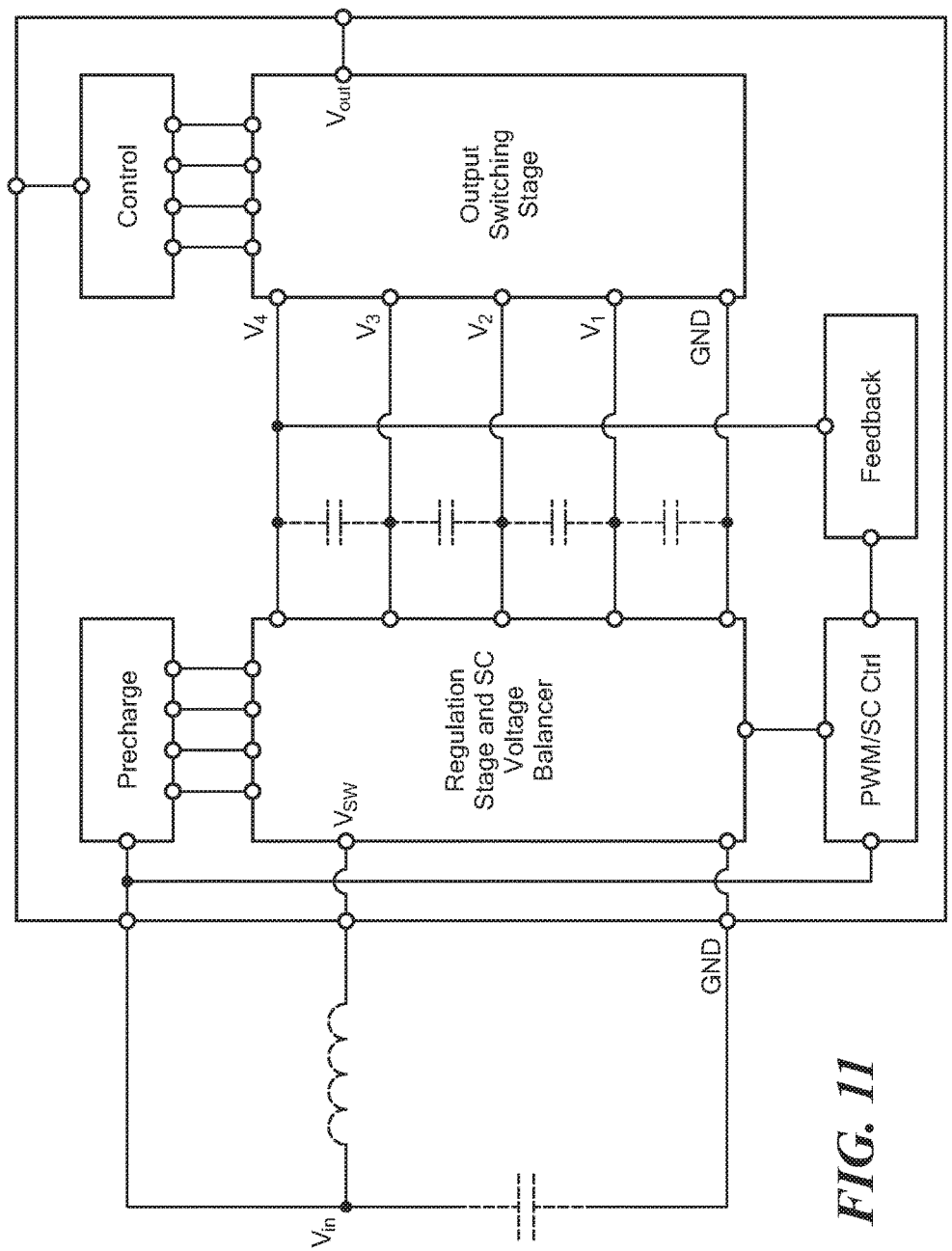
FIG. 11 is a block diagram of an exemplary integrated power supply and modulator system including startup circuitry, feedback/feedforward circuitry, and control circuitry.

Referring now to FIG. 11, an integrated power supply and modulator system includes a switched-capacitor voltage balancer stage coupled between a magnetic regulation stage and at least one output switching stage. The system further includes startup circuitry, a control system and a feedback system. Thus, FIG. 11 illustrates an overall system. In addition to the blocks previously described, several additional elements may be present in the whole system. The startup circuitry may include, for example, a "precharge" system. The precharge system may include a circuit to precharge the capacitors in each level to the desired voltages and prevent the devices from exceeding their rated breakdown voltages during start-up or transients. For example, linear regulator, clamping or other circuitry may be used to bring the individual capacitor voltages uniformly into an allowable range, and the system may further include one or more blocking switches to protect the system from out-of-range input voltages. The precharge system may also include "soft-start" for the magnetic regulation function of the system, under-voltage lockout for various system functions, etc.

Figure 12A:
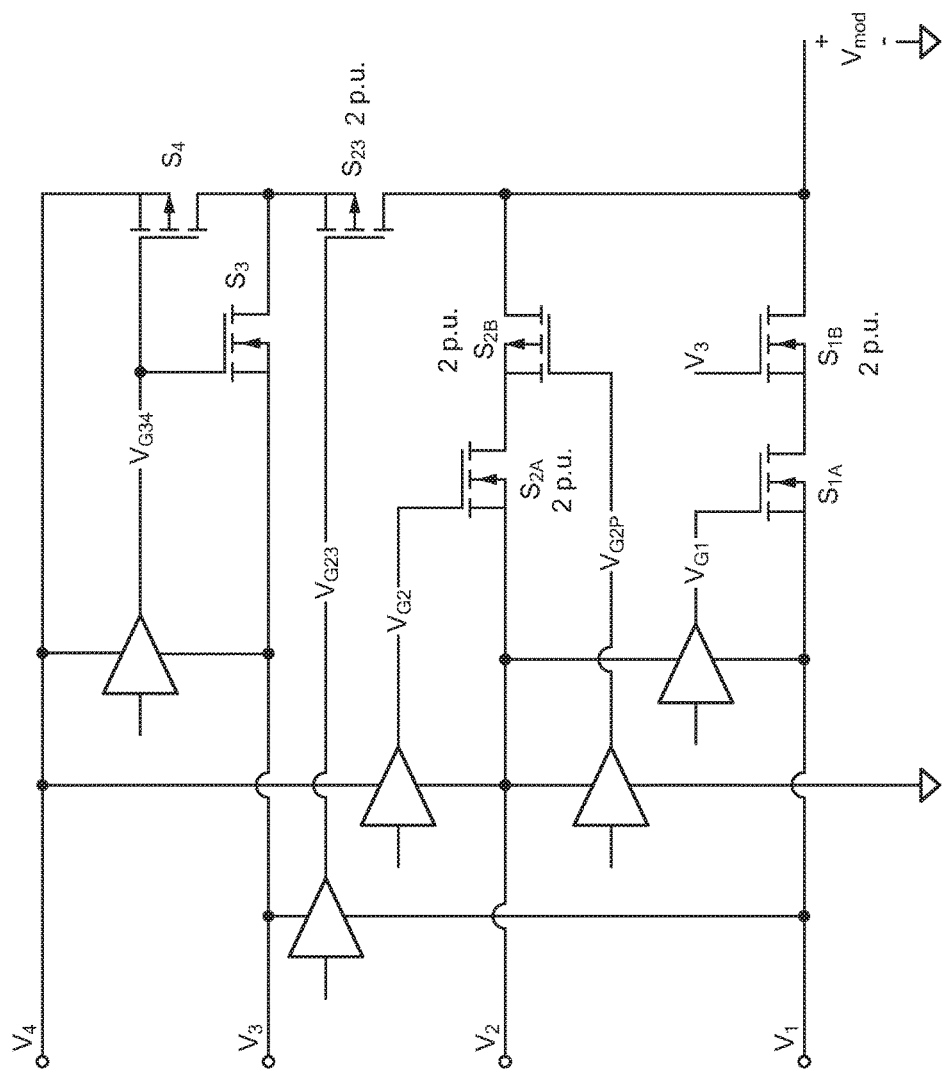
FIG. 12A is a schematic diagram of an exemplary implementation of a modulator stage, including gate drivers.

Referring now to FIG. 12A, an implementation of a modulator stage, including gate drivers is shown. This implementation takes advantage of the set of ratiometric voltages available to avoid the need for "flying" gate drivers and bootstrap capacitors, takes advantage of the power stage capacitors for the drivers, and enables simple level-shifting for inputs to the drivers.

It is assumed in this design example that $V_1$=1.2 V, $V_2$=2.4 V, $V_3$=3.6 V, and $V_4$=4.3 V. "Base" switches for implementing the circuit of FIG. 12A may be rated, for example, at 1.8 V drain-source voltage, and switches labeled "2 p.u." (e.g., switches $S_{1B}$, $S_{2A}$, $S_{2B}$, and $S_{23}$) may be rated at 3.3 V drain-source voltage for implementation in a typical 180 nm node semiconductor process.

In the driver scheme, every gate driver is referenced to a fixed potential. A gate-source voltage of 1.2 V is provided to drive the 1.8 V devices and a gate-source voltage of 2.4 V-3.6 V is provided to drive the 3.3 V devices. The switch states implemented by the gate drivers are shown in Table 2 below.

TABLE 2

|       | $S_{1A}$ | $S_{1B}$ | $S_{2A}$ | $S_{2B}$ | $S_{23}$ | $S_3$ | $S_4$ |
|-------|------|------|------|------|------|-----|-----|
| $V_1$ | 1 | 1 | 1 | 0 | 0 | 1 | 0 |
| $V_2$ | 0 | 0 | 1 | 1 | 0 | 1 | 0 |
| $V_3$ | 0 | 0 | 0 | 1 | 1 | 1 | 0 |
| $V_4$ | 0 | 0 | 0 | 1* | 1 | 0 | 1 |

Table 2 shows the switch states required to achieve desired output voltages for the circuit in FIG. 12A.
The asterisk * in Table 2 indicates that the switch $S_{2B}$ has its gate voltage switched from ground to $V_2$ in this state to prevent the device from damaging the gate.

Figure 12B:
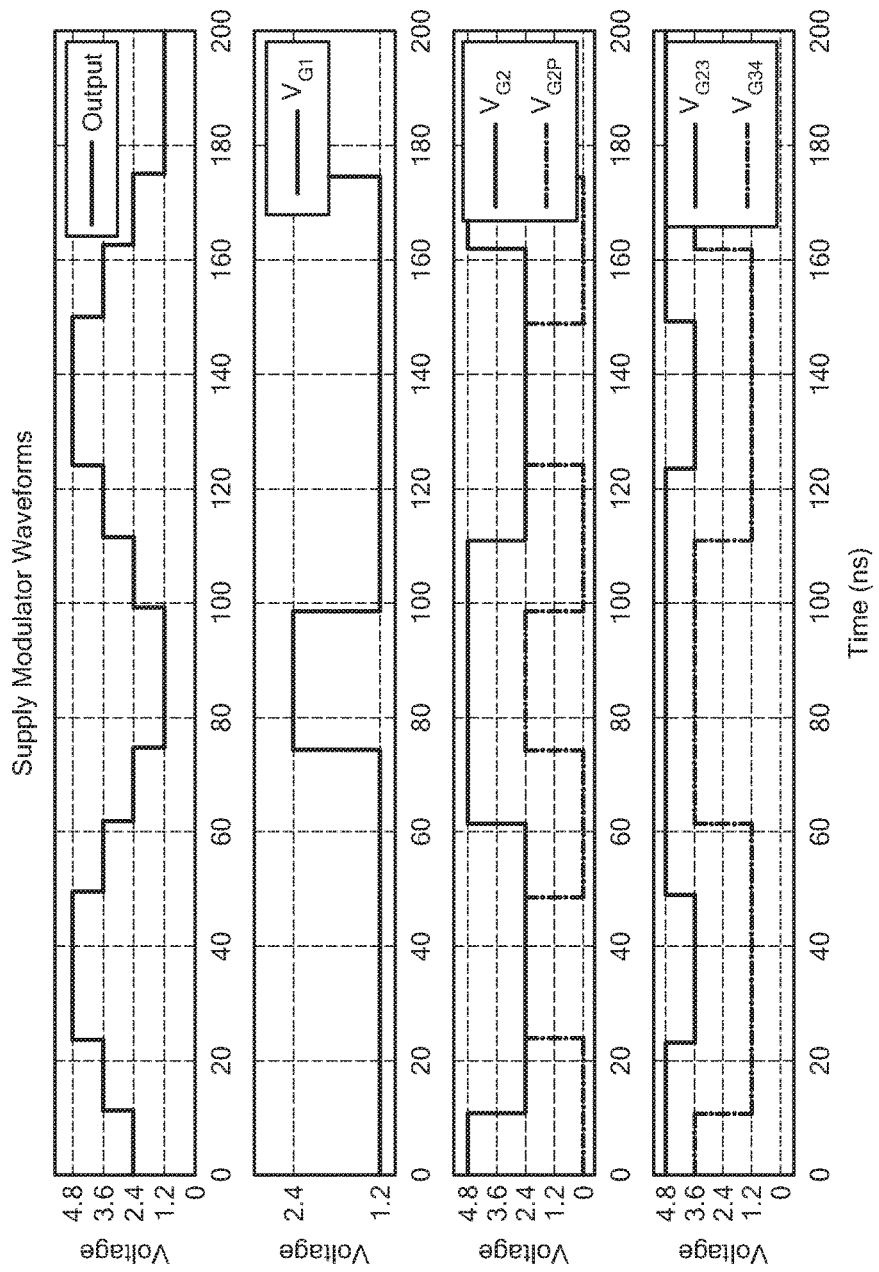
FIG. 12B is a plot showing operating waveforms for the circuit of FIG. 12A.

FIG. 12B shows the voltages associated with selecting various output levels. In the staircase voltage pattern demonstrated in this example, every device has the same switching frequency as the staircase (once on/of cycle per staircase period) except $S_{2B}$, which switches at twice this frequency. The reason this switch is modulated more often is to provide sufficient gate drive for the 3.3 V devices and also limit the gate-source voltage of the device within the safe operation range (e.g., to limit the gate-source voltage to maximum of 3.6 V for a typical 180 nm node semiconductor process).

Figure 13A:
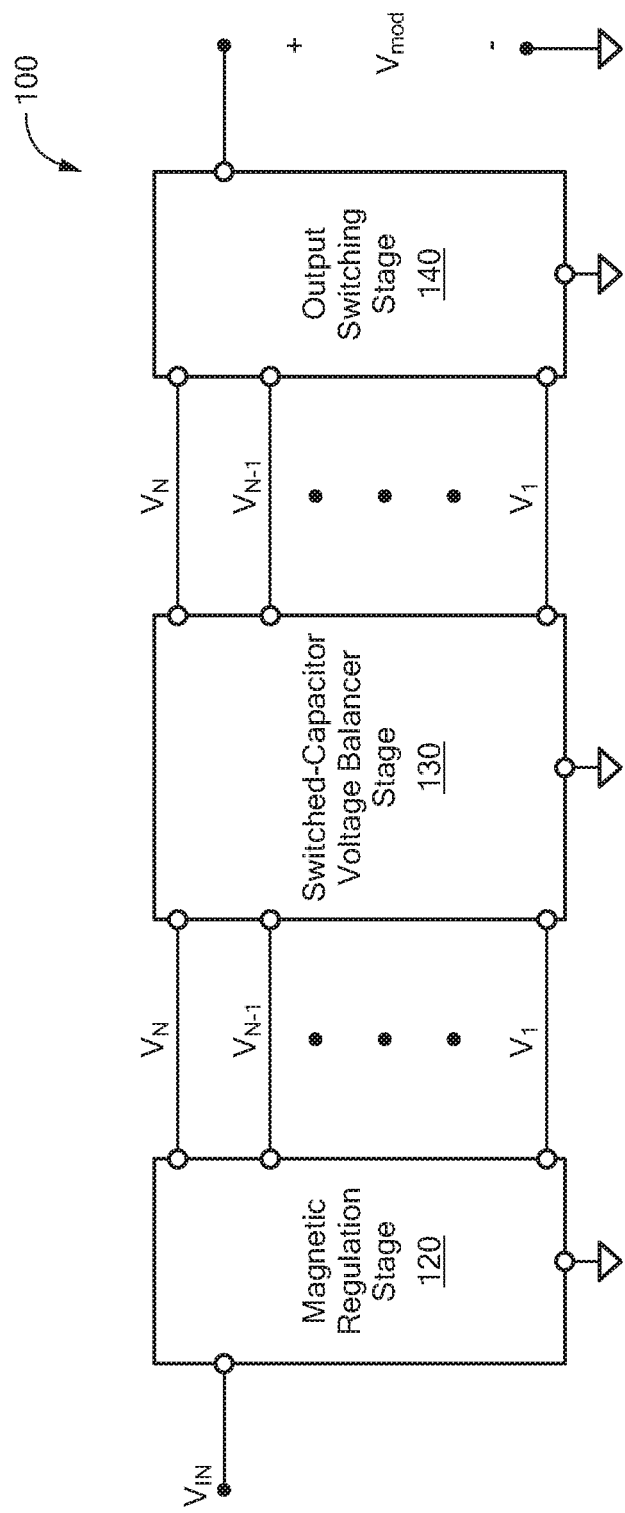
FIG. 13A is block diagram illustrating another exemplary integrated power supply and modulator system.

Referring now to FIG. 13A, shown is an exemplary integrated power supply and modulator system 100, which can be the same as or similar to integrated power supply and modulator system 10 of FIG. 1. The integrated power supply and modulator system 100 is configured to achieve regulated power conversion for modulation of a power amplifier (PA). In particular, a magnetic regulation stage 120 regulates one or more outputs of a switched-capacitor voltage balancer stage 130, while the switched-capacitor voltage balancer stage 130 maintains distribution of conversion ratios. With this arrangement, the set of output voltage levels of an output switching stage 140, and in turn output power of the PA, can be scaled down continuously while maintaining high efficiency (e.g., to provide efficient backoff over a wide average power range). In addition, the output power (or set of ratio-metric outputs) can be held to a desired level as an input supply voltage, denoted by $V_{IN}$, varies (e.g., to reduce the effects of battery voltage variation/discharge on operating range of the PA).

Figure 13B:
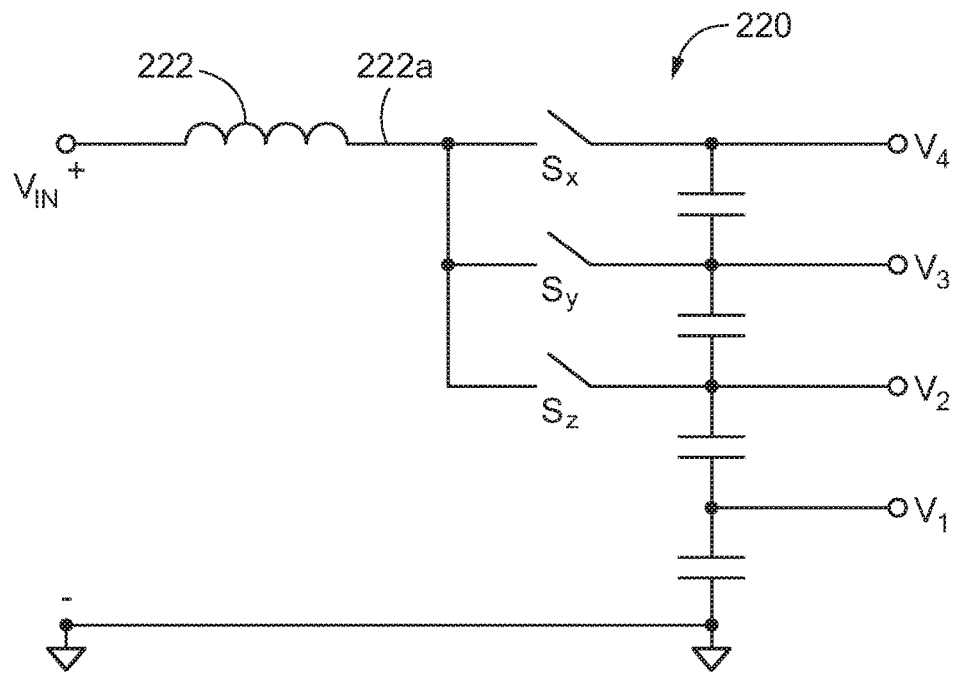
FIG. 13B is a schematic diagram illustrating a multi-level magnetic regulation stage which can be used in conjunction with the exemplary integrated power supply and modulator system of FIG. 13A.

Referring now to FIG. 13B, shown is a multi-level magnetic regulation stage 220, which according to soma embodiments can be used in conjunction with the exemplary integrated power supply and modulator system 100 of FIG. 13A. In other embodiments, the multi-level magnetic regulation stage 220 can replace magnetic regulation stage 120 of FIG. 13A. Additionally, it is to be appreciated that the multi-level magnetic regulation stage 220 can be configured to operate in the same manner as the multi-level magnetic regulation stage of FIG. 10. Output terminal 222a of inductor 222 of the multi-level magnetic regulation stage 220 is configured to switch among three capacitor voltage levels by means of switches $S_x$, $S_y$, $S_z$ to produce one or more of output voltages levels $V_1$, $V_2$, $V_3$, $V_4$. Output voltage level $V_4$, for example, can be regulated down to a minimum value equal to input voltage $V_{IN}$, enabling the multi-level magnetic regulation stage 220 to act as a boost-derived magnetic regulation stage. It will be appreciated that by adding additional switches, capacitors, and connectors, other magnetic regulation stage topologies can be generated, including, but not limited to buck-boost derived topologies.

An advantage of using the multi-level magnetic regulation stage 220 of FIG. 13B over other magnetic regulation topologies, for example, is that if can provide for a wider and/or different control range of voltages in the switched-capacitor voltage balancer stage 130 of FIG. 13A. Such can be valuable for handling wide backoff ranges (e.g., providing low voltages under backoff conditions), or for managing very wide input voltage ranges (e.g., to handle different battery/charger conditions). For example, it may be desirable to regulate voltage $V_4$ of the multi-level magnetic regulation stage 220 to some value below the input voltage $V_{IN}$ in order to enable very low voltage levels applied to the PA under backoff. Other exemplary magnetic regulation stage implementations, including ones good for providing small voltages for deep-backoff operation of PAs with an integrated power supply and modulation system, are shown and discussed below with respect to FIGS. 13C-13E. If will be appreciated that although the exemplary magnetic regulation stage implementations disclosed herein show four voltage levels, the techniques can be applied to magnetic regulation stage implementations having greater or fewer voltage levels. One of ordinary skill in the arts after reading the disclosure provided herein will understand how to select the number of voltage levels for any particular application.

Figure 13C:
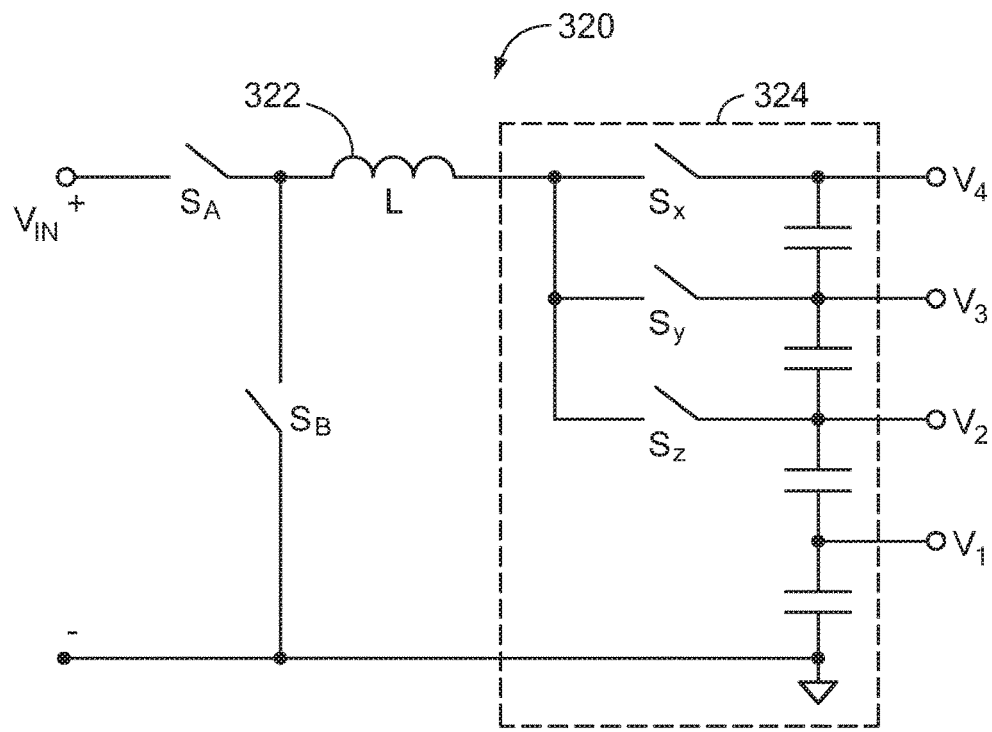
FIG. 13C is a schematic diagram illustrating a magnetic regulation stage that is capable of providing both buck and boost conversion in accordance with an embodiment.

Referring now to FIG. 13C, shown is a magnetic regulation stage 320 providing for both buck and boost capability from a first voltage (illustrated in this exemplary embodiment as an input voltage $V_{IN}$) to a second voltage (illustrated in this exemplary embodiment as output voltage level $V_4$). Such configuration is herein referred to as a buck-boost-derived magnetic regulation stage. If switch $S_A$ is closed, for example, switches $S_X$, $S_Y$, $S_Z$ can be modulated to provide output voltage level regulation in a manner substantially the same as or similar to multi-level magnetic regulation stage 220 of FIG. 13B. Alternatively, with switch $S_X$ closed and switches $S_A$ and $S_B$ modulated, output voltage level $V_4$ can be regulated below the input voltage $V_{IN}$, thereby providing "buck mode" operation which is useful for efficiently controlling power under backoff of the PA. Switched-capacitor stage 324 provides charge redistribution to maintain ratio-metric voltage levels among output voltages levels $V_1$, $V_2$, $V_3$, $V_4$. In another operation mode, one or more of switches $S_A/S_B$ and one or more of switches $S_X/S_Y/S_Z$ are modulated to regulate output voltages levels $V_1$, $V_2$, $V_3$, $V_4$.

Alternative open/closed configurations of switches $S_A$, $S_B$, $S_X$, $S_Y$, and $S_Z$ can be used to provide useful connections between inductor stage 322 and the switched capacitor stage 324. The alternative configurations can yield different desirable conversion functions, therein reducing the required inductor size and/or inductor ripple and/or switch voltage stress for a given operating range. For example, connections of the input side of inductor 322 can be used to provide buck (and/or buck-boost) functionality to the magnetic regulation stage 320, as illustrated by magnetic regulation stage 420 of FIG. 13D.

Figure 13D:
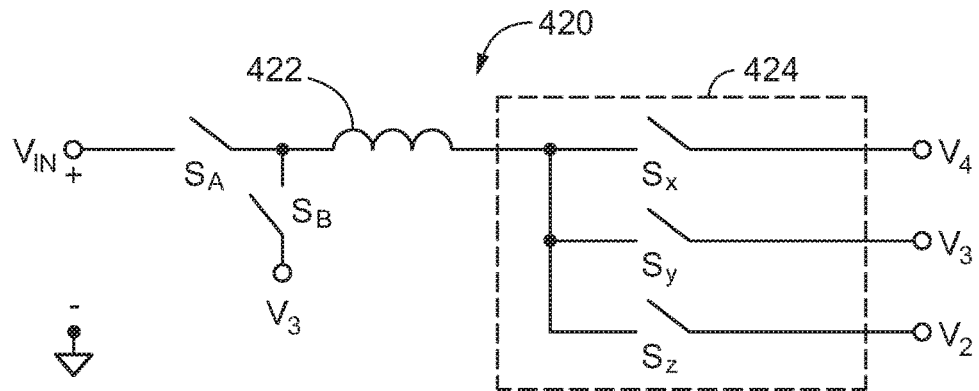
FIG. 13D is a schematic diagram illustrating a magnetic regulation stage similar to that of FIG. 13C but having a switch $S_B$ that is configured to connect an input side of an inductor L to an output voltage level $V_3$ of a switched capacitor stage instead of ground.

Referring now to FIG. 13D (in which capacitors are omitted from the drawings for simplicity in the drawing figure), switch $S_B$ of the magnetic regulation stage 420 is configured to connect input side of inductor 422 to output voltage level $V_3$ of switched capacitor stage 424, instead of ground, as shown in magnetic regulation stage 320 of FIG. 13C, for example. If switch $S_X$ of magnetic regulation stage 420 is continuously closed, and switches $S_A$ and $S_B$ are modulated (with $S_A$ having duty ratio D and $S_B$ having duty ratio 1−D), a steady state conversion ratio between the input voltage and the switched capacitor output voltage level $V_4$ is given by:

$$\frac{V_4}{V_{IN}} = \frac{D}{0.25 + 0.75 \cdot D}$$

As with magnetic regulation stage 320 of FIG. 13C, magnetic regulation stage 420 of FIG. 13D provides for "buck" operation (regulating $V_4$ below $V_{IN}$ by adjusting duty ratio D) with a different conversion function. Importantly, however, voltage ripple amplitude across inductor 422 is reduced in comparison to inductor 322 of FIG. 13C. Additionally, magnetic regulation stage 420 provides for a reduced required inductor value and/or size for a given allowable inductor current ripple (or alternatively reduced inductor current ripple for a given inductor value/size). Moreover, an off-state switch voltage on switches $S_A$ and $S_B$ is $V_{IN}$-$V_3$ in the configuration of FIG. 13D, rather than $V_{IN}$ in the configuration of FIG. 13C, therein reducing required device voltage stress. Such can enable an improved implementation of switches $S_A$, $S_B$, $S_X$, $S_Y$, and $S_Z$ and an improved gate drive of said switches. For example, by selecting an appropriate converter level in switched capacitor network 424, one can take advantage of device voltages available in a given magnetic regulation stage to achieve voltages of one or more of $S_A$ and/or $S_B$ closed in individual devices (or stacks of devices) having voltage ratings lower than the input voltage $V_{IN}$.

As with the magnetic regulation stage implementations discussed above in conjunction with FIGS. 13B and 13C, it is desirable to implement switches $S_A$, $S_B$, $S_X$, $S_Y$, and $S_Z$, for example, such that they may be used with low-voltage devices and avoid flying drivers. In some embodiments, the approaches discussed above with respect to FIGS. 9 and 10 for implementing boost switches and their drivers to implement switches $S_A$ and/or $S_B$ and/or their drivers (e.g., cascoding devices and/or forming switches from "stacked" devices driven from coordinated drivers). Additionally, multi-level buck modulation may be implemented as part of buck-boost modulation in a manner similar to boost switches of FIGS. 9 and 10, as illustrated in FIG. 13E.

Figure 13E:
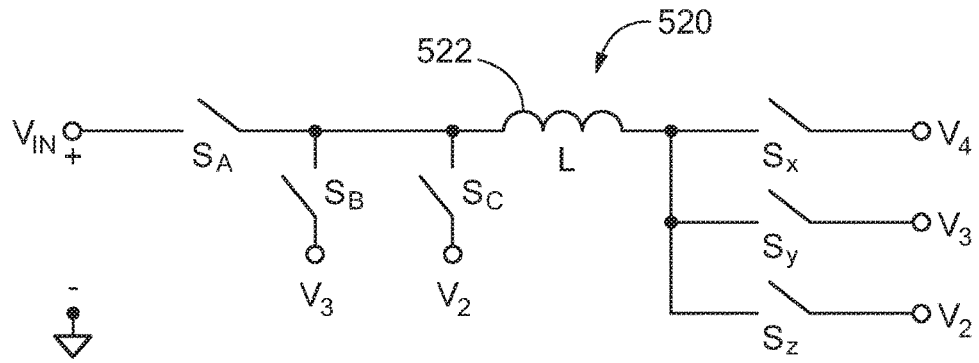
FIG. 13E is a schematic diagram illustrating an exemplary magnetic regulation stage having a buck-boost topology with multilevel modulation in accordance with an embodiment.

Referring now to FIG. 13E, shown is an exemplary magnetic regulation stage 520 in a buck-boost derived topology with multilevel modulation. Input-side switches $S_A$, $S_B$, and $S_C$ of inductor 522 are configured to modulate among input voltage $V_{IN}$ and switched capacitor output voltage levels $V_2$ and $V_3$, while output-side switches $S_X$, $S_Y$, and $S_Z$ of the inductor 522 are configured to modulate among switched capacitor output voltage levels $V_2$, $V_3$, and $V_4$. In particular, inductor input side switches $S_A$, $S_B$, and $S_C$ modulate the inductor input-side voltage among any subset of input voltage $V_{IN}$, ground, and switched capacitor output voltage levels, while the inductor output-side switches $S_X$, $S_Y$, and $S_Z$ modulate among any subset of the input voltage, ground, and switched capacitor output voltage levels. A variety of operating modes may be used, including: (1) modulating inductor-input-side switches $S_A$, $S_B$, and $S_C$ while maintaining the inductor-output-side switches $S_X$, $S_Y$, and $S_Z$ in a fixed configuration; (2) modulating the inductor-output-side switches while maintaining said inductor-input-side switches in a fixed configuration; and (3) modulating both inductor-input-side switches and inductor-output-side switches at the same time. The above operating modes provide a great deal of flexibility in voltage conversion range, inductor ripple, and achievable response speed.

It is notable that while FIGS. 13C-13E illustrate exemplary magnetic regulation stage circuits that are buck-boost derived, related buck-derived magnetic regulation stage circuits can be achieved by eliminating the switches at the output side of the inductor and instead directly connecting the output side of the inductor to one of the indicated output voltage levels of the former switched capacitor output voltage levels shown and described above in conjunction with FIGS. 13C-13E. In such configurations, the output voltage level to which the inductor is connected is capable of being modulated to values below the input voltage, with other output voltage levels tracking ratiometrically, as determined by the switched-capacitor voltage balancer stage.

If a substantial variable buck function is to be implemented in the exemplary magnetic regulation stages disclosed herein, therein yielding widely varying switched capacitor output voltage levels, logic levels for the drivers may be derived from a set of voltages that do not vary as much as the switched capacitor voltage levels. Such can be achieved, for example, by selecting and/or linear regulating from one or more of the input voltage $V_{IN}$ and the switched capacitor output voltage levels to create a set of desired driving and logic levels that are appropriate across the operating range of the magnetic regulation stage circuit. In some embodiments, the switched capacitor output voltage levels can regulated with on-die capacitors to achieve further voltage regulation, for example. In other embodiments, the driving and logic levels are set by fixed reference voltages or, alternatively, by reference voltages adapted to a desired operating condition.

Figure 13F:
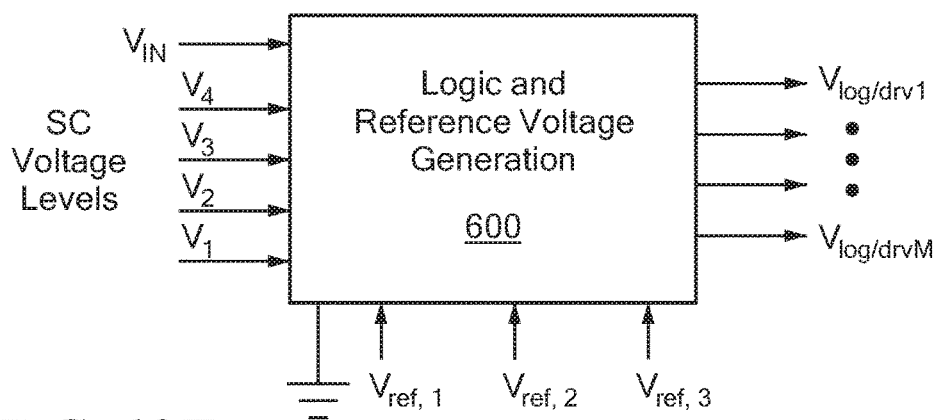
FIG. 13F is a block diagram illustrating a logic and reference generation circuit having a first plurality of terminals configured to receive a first plurality of voltages and a second plurality of terminals configured to provide a second plurality of voltages in accordance with an embodiment.

Referring now to FIG. 13F, a logic and reference voltage generation circuit 600 has a first plurality of terminals configured to receive a first plurality of voltages $V_{IN}$, $V_1$, $V_2$, $V_3$, $V_4$ and a second plurality of terminals (denoted as M terminals in this exemplary embodiment) configured to provide a second plurality of voltages $V_{log/drv1}$-$V_{log/drvM}$. It should be noted that in this exemplary embodiment, the voltages denoted $V_1$, $V_2$, $V_3$, $V_4$ correspond to SC voltage levels and that although four voltage levels are shown, those of ordinary skill in the art will appreciate that any number of SC voltage levels may be used. Logic and reference voltage generation circuit 800 is also configured to receive one or more reference voltages at one or more reference input ports.

Figure 14A:
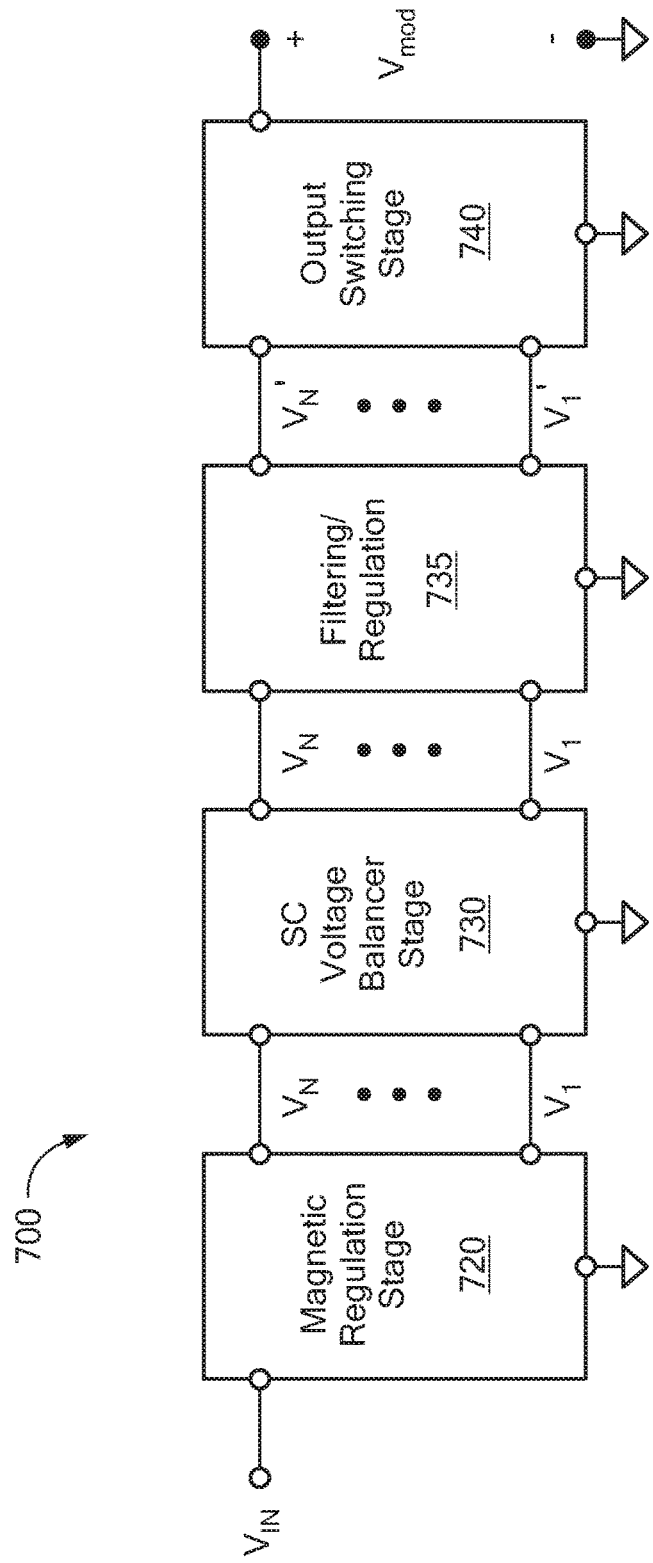
FIG. 14A is a block diagram illustrating an exemplary integrated power supply and modulator system having a filtering and/or regulation block between a switched-capacitor voltage balancer stage and an output switching stage.

Referring now to FIG. 14A, shown is another exemplary integrated power supply and modulator system 700, which can be the same as or similar to integrated power supply and modulator system 100 of FIG. 13A with the addition of a filtering and/or regulation block between the switched-capacitor voltage balancer stage and the output switching stage. Referring briefly now to FIG. 13A, it is desirable for the output voltage $V_{mod}$ provided by the output switching stage 140 to be stable and without substantial ripple or noise. As a result, it may be desirable to provide filtering, damping, and/or additional regulation to the output voltages generated by the switched-capacitor voltage balancer stage 130. Such can be accomplished, for example, with passive physical (e.g., LCR) filter structures. Alternatively, such can be accomplished with active circuits, for example, using linear series regulation and/or shunt ripple filtering to reduce noise. One embodiment using active circuitry employs variable driving of the output voltages of the output switching stage 140 to reject or compensate for voltage ripple in the output voltages of the switched-capacitor voltage balancer stage 130.

Alternatively, referring again to FIG. 14A, the above mentioned functionality can be provided as part of the switched-capacitor voltage balancer stage 730 or as a separate filtering/regulation stage 735 between the switched-capacitor voltage balancer stage 730 and the output switching stage 740. The added linear regulation in the filtering/regulation stage 735 of FIG. 14A may reduce the efficiency of the integrated power supply and modulator system 700. However, the filtering/regulation stage 735 may provide sufficiently controlled voltage(s) supplied to the output switching stage 740 to simplify linearization requirements and adaptation in the integrated power supply and modulator system 700. For further improvement, a damping resistance can be added in the switched-capacitor voltage balancer stage 730 to mitigate any ringing that may occur at switch transitions of the switched-capacitor voltage balancer stage 730 and/or the magnetic regulation stage 720. It is notable that one may provide additional series linear regulation or active ripple filtering or damping of voltages at the switched-capacitor voltage balancer stage 730 to reduce noise further and gain additional control of the voltages provided to the output switching stage 740.

Figure 14B:
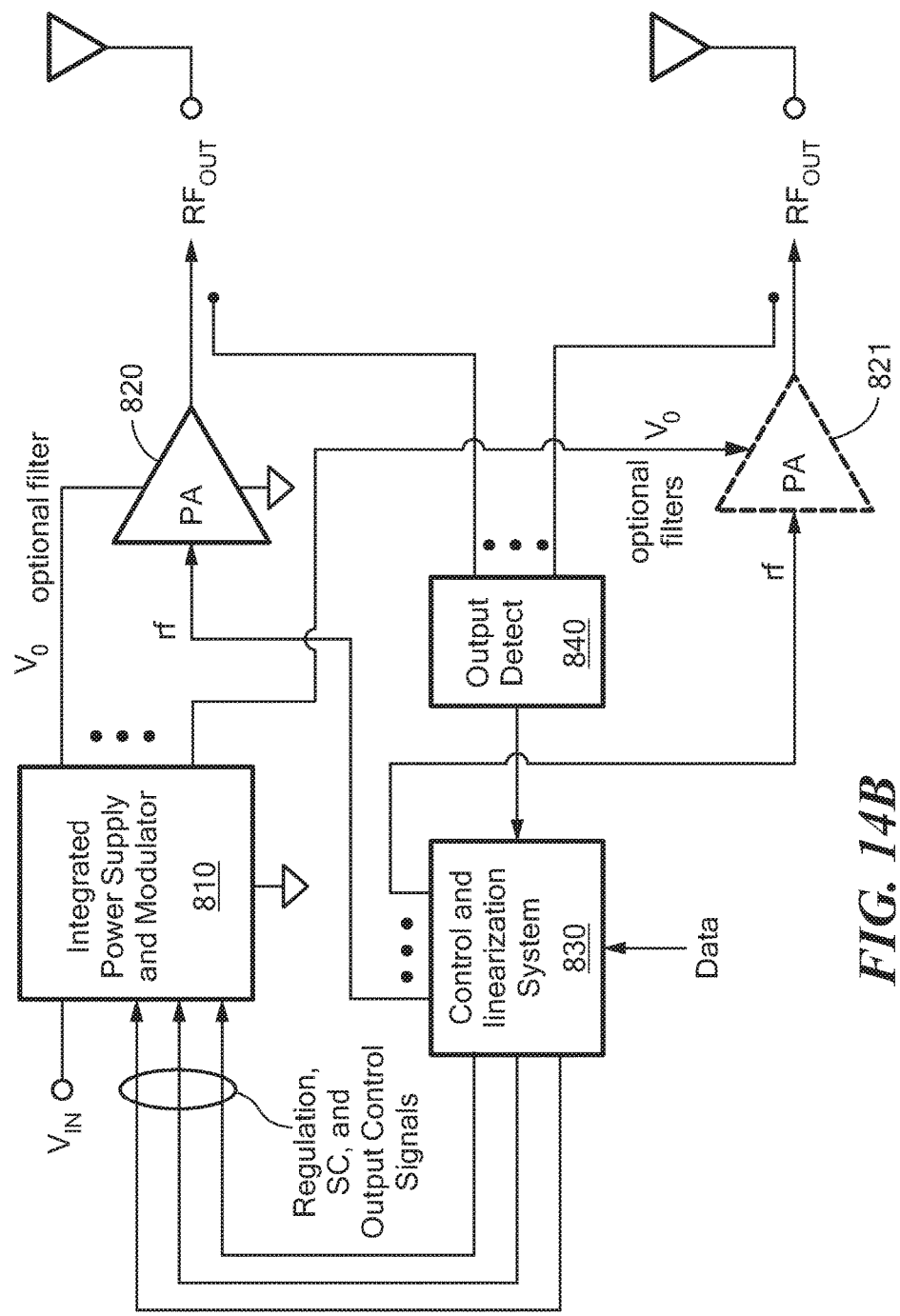
FIG. 14B is a block diagram illustrating an exemplary integrated power supply and modulator with a power amplifier, control circuitry, and optional sensing circuitry for adaptation/linearization.

Referring now to FIG. 14B, shown is an integrated power supply and modulator 810 with a power amplifier 820, control circuitry 830, and optional sensing circuitry 840 for adaptation/linearization.

In realizing such a system, drive control of the power amplifier 820 is coordinated with the control of the drain modulator to provide the desired RF output. Information derived from measuring the output can be used to adaptively adjust the driving signals of the power amplifier 820 and the drain modulator (e.g., to linearize the power amplifier 820 through adaptive predistortion). It should be noted that in order to adaptively linearize to high accuracy, it may be desirable to blank acquisition of the RF output data (e.g., not sample or sample but eliminate from use) during or around switching transitions of the magnetic regulation stage and/or SC voltage balancer stage. That is, better linearization of the system may be achieved by coordinating the operation of the linearization system or RF output acquisition with the operation of the power supply. This may be accomplished, for example, by coordinating the timing of rf output data acquisition with the timing of the switching of the integrated power supply and modulator 810 (including the switch transition timing of the magnetic regulation stage and/or SC voltage balancer).

Further considering the system of FIG. 14B, it should be noted that an optional filter may be provided as part of the voltage modulator stage or between the output of the voltage modulator and the PA drain input. This filter could be a passive reciprocal filter (e.g., including one or more of inductors, resistors, capacitors, and transmission lines), or may be a nonreciprocal and/or active filter (e.g., including active devices such as transistors and op-amps and/or passive devices such as circulators).

It should be further noted that the power amplifier system of FIG. 14B can be realized with a variety of types of power amplifiers, including single-transistor amplifiers, balanced amplifiers, and Doherty amplifiers. Moreover, while FIG. 14B illustrates a single drain modulation output and PA, a single-output system may also comprise two or more PAs with either common or different drain voltages provided by the modulator and either different drive inputs or a common drive input with an analog splitting network. The plurality of PAs can have their outputs combined to a single output with either an isolating combiner or through a lossless combiner such as a Chireix combiner or multiway lossless combiner. Likewise, one may have a multi-stage power amplifier in which one or more stages are drain modulated by the integrated power supply and modulator 810, thus leveraging common elements such as the integrated power supply system. Finally, as shown in FIG. 14B, multiple-rf-output systems can be realized using an integrated power supply and modulator having multiple modulator outputs coupled to multiple PAs (e.g., PA 820 and one or more optional PAs 821). This could include designs for driving power amplifiers for different bands or frequencies, for transmit diversity or MIMO, or for other purposes. Thus, while FIG. 14B shows a relatively simple configuration, it will be appreciated that amplifier systems (e.g., power amplifier systems, etc.) having greater complexity can be realized with the proposed integrated power supply and modulator system 810.

While particular embodiments of concepts, systems, circuits and techniques have been shown and described, it will be apparent to those of ordinary skill in the art that various changes and modifications in form and details may be made therein without departing from the spirit and scope of the concepts, systems and techniques described herein. For example, some of the presented implementation examples show a system with a boost-type (or boost-derived) magnetic regulation stage. It will be appreciated that by adding appropriate switches and connections, other magnetic regulation stage topologies could likewise be used, including buck or buck-boost derived topologies. Similarly, alternative switched-capacitor conversion structures could be employed, and other output switching network topologies or switch implementations could be employed. Other combination or modifications are also possible al of which will be readily apparent to one of ordinary skill in the art after reading the disclosure provided herein.

It is felt, therefore that the concepts, systems, circuits and techniques described herein should not be limited by the above description, but only as defined by the spirit and scope of the following claims which encompass, within their scope, all such changes and modifications.

The invention claimed is:

1. An integrated power supply and modulator system comprising:
  a magnetic regulation stage having an input to receive an input voltage and at least one output at which is provided a regulated output voltage;
  a switched-capacitor voltage balancer stage comprising a plurality of capacitors and having an input coupled to the at least one output of said magnetic regulation stage and having output voltage nodes, said switched-capacitor voltage balancer stage configured to receive a regulated output voltage from said magnetic regulation stage at the input thereof and to ratiometrically redistribute the generated voltages provided thereto from the magnetic regulation stage and to substantially, continuously maintain the ratiometrically redistributed voltages at the plurality of output voltage nodes by redistributing charge among the capacitors of said switched-capacitor voltage balancer stage, wherein the switched-capacitor voltage balancer stage further comprises:
    first and second sets of switches, wherein the first set of switches switch on and off together in a complementary fashion with the second set of switches; and
    a set of transfer capacitors, wherein the transfer capacitors operate to transfer charge among the capacitors in a capacitor stack as the first and second sets of switches are switched to maintain the substantially ratiometric set of voltages on the plurality of voltage nodes; and
  an output switching stage configured to selectively couple at least two voltages from the plurality of output voltage nodes of said switched-capacitor voltage balancer stage to an output of the output switching stage in response to one or more control signals and wherein in response to currents fed to the plurality of voltage nodes from said magnetic regulation stage and currents drawn from the plurality of nodes by said output switching stage, said switched-capacitor voltage balancer stage substantially, continuously maintains the ratiometrically redistributed voltages at the plurality of output voltage nodes with respect to a reference potential.

2. The integrated power supply and modulator system of claim 1 wherein the magnetic regulation stage comprises:
  an inductor having a first end and a second end; and
  a set of at least at least two switches to selectively couple at least one of the first and second ends of the inductor among two or more of:
    (a) the input of the magnetic regulation stage;
    (b) a first voltage node in the plurality of output voltage nodes of the switched-capacitor voltage balancer stage; and
    (c) a second voltage node in the plurality of output voltage nodes of the switched-capacitor voltage balancer stage.

3. The system of claim 2, wherein:
  in response to currents fed to the plurality of voltage nodes from said magnetic regulation stage and currents drawn from the plurality of nodes by said output switching stage, said switched-capacitor voltage balancer stage is configured to maintain a ratiometric set of voltages on the plurality of voltage nodes with respect to the reference potential; and
  the set of at least two switches in said magnetic regulation stage comprises:
    a first switch coupled between the input of the magnetic regulation stage and the first end of the inductor; and
    a second switch coupled between the first end of the inductor and the first voltage node in the plurality of voltage nodes of the switched-capacitor voltage balancer stage, wherein the magnetic regulation stage is configured to operate in at least one operating mode to provide buck conversion from the input voltage to a selected voltage node of the switched-capacitor voltage balancer stage, wherein the second end of the inductor is conductively coupled to the selected voltage node of the switched-capacitor voltage balancer stage when and the first and second switches are switched in a complementary fashion.

4. The system of claim 3, wherein the set of at least two switches further comprises:
a third switch coupled between the first end of the inductor and the second voltage node in the plurality of voltage nodes of the switched-capacitor voltage balancer stage, wherein the second voltage node is different from the first voltage node, wherein the magnetic regulation stage is capable of performing buck conversion in response to the second end of the inductor being conductively coupled to one of the voltage nodes of the switched-capacitor voltage balancer stage and the first and third switches being switched in a complementary fashion.

5. The system of claim 3, wherein the set of at least two switches further comprises:
a third switch coupled between the second end of the inductor and a first output of the magnetic regulation stage; and
a fourth switch coupled between the second end of the inductor and a second output of the magnetic regulation stage;
wherein the first output is coupled to one voltage node of the switched-capacitor voltage balancer stage and the second output is coupled to another, different voltage node of the switched-capacitor voltage balancer stage.

6. The system of claim 5, wherein the set of at least two switches further comprises:
at least one additional switch coupled between the second end of the inductor and an output of the magnetic regulation stage other than the first and second outputs, wherein the output of the magnetic regulation stage other than the first and second outputs is coupled to a voltage node of the switched-capacitor voltage balancer stage other than the voltage nodes coupled to the first and second outputs.

7. The system of claim 5, further comprising:
control circuitry to control the magnetic regulation stage, the switched-capacitor voltage balancer stage, and the output switching stage, wherein the control circuitry is configured to control states of switches within the magnetic regulation stage to selectively achieve at least two of boost conversion, buck conversion, and buck/boost conversion within the magnetic regulation stage.

8. The system of claim 7, wherein:
the control circuitry is configured to achieve desired voltages on the plurality of voltage nodes of the switched-capacitor voltage balancer stage, in part, by selecting one of boost or buck conversion for the magnetic regulation stage and by setting switching duty cycles for switches of the magnetic regulation stage.

9. The system of claim 1, wherein:
the switched-capacitor voltage balancer stage comprises a switched-capacitor ladder circuit.

10. The system of claim 1, wherein:
the plurality of voltage nodes of the switched-capacitor voltage balancer stage are part of the capacitor stack, with each voltage node being directly coupled to at least one capacitor in the stack, wherein the plurality of voltage nodes includes a highest-voltage node at the top of the stack and a lowest-voltage node at the bottom of the stack.

11. The system of claim 1, wherein:
the output switching stage comprises a plurality of switch sets, each switch set having a corresponding output, wherein each switch set is configured to selectively couple a selected one of the voltage nodes of the switched-capacitor voltage balancer stage to a corresponding output, wherein the plurality of switch sets includes at least a first switch set and a second switch set that operate independently of one another.

12. An integrated power supply and modulator system comprising:
a magnetic regulation stage having an input to receive an input voltage and at least one output to deliver a regulated output voltage;
a switched-capacitor voltage balancer stage having a plurality of voltage nodes to carry and ratiometrically redistribute generated voltages of the magnetic regulation stage, at least one of the plurality of voltage nodes being coupled to one of the at least one outputs of the magnetic regulation stage, wherein the switched-capacitor voltage balancer stage is configured to continuously maintain a substantially ratiometric set of voltages on the plurality of voltage nodes with respect to a reference potential wherein said switched-capacitor voltage balancer stage maintains the ratiometric set of voltages at the plurality of voltage nodes in response to: charge introduced to said switched-capacitor voltage balancer stage at any of the plurality of voltage nodes; and charge drawn from said switched-capacitor voltage balancer stage at any of the plurality of voltage nodes, wherein the switched-capacitor voltage balancer stage further comprises:
first and second sets of switches, wherein the first set of switches switch on and off together in a complementary fashion with the second set of switches; and
a set of transfer capacitors, wherein the transfer capacitors operate to transfer charge among the capacitors in a capacitor stack as the first and second sets of switches are switched to maintain the substantially ratiometric set of voltages on the plurality of voltage nodes; and
an output switching stage comprising a switch set having an output, wherein the switch set is configured to selectively couple a selected one of the voltage nodes of the switched-capacitor voltage balancer stage to the output.

13. The system of claim 12, wherein:
the output switching stage comprises a plurality of switch sets, each switch set having a corresponding output, wherein each switch set of the plurality of switch sets is configured to selectively couple a voltage from a selected one of the voltage nodes of the switched-capacitor voltage balancer stage to a corresponding output, wherein the plurality of switch sets includes at least a first switch set and a second switch set that operate independently of one another.

14. The system of claim 13, wherein:
the output of the first switch set in the plurality of switch sets is coupled to a first power amplifier and the output of the second switch set in the plurality of switch sets is coupled to a second power amplifier that is different from the first power amplifier.

15. The system of claim 13, wherein:
the output of the first switch set in the plurality of switch sets is coupled to an amplifier in one stage of a multi-stage power amplification system and the output of the second switch set in the plurality of switch sets is coupled to an amplifier in a different stage of the multi-stage power amplification system.

16. The system of claim 13, wherein:
the output of the first switch set in the plurality of switch sets is coupled to an amplifier driving a first transmit antenna in a multiple input, multiple output (MIMO) enabled wireless transmitter and the output of the second switch set in the plurality of switch sets is coupled to an amplifier driving a second, different transmit antenna in the MIMO enabled wireless transmitter.

17. The system of claim 13, wherein:
the output of the first switch set in the plurality of switch sets is coupled to an amplifier driving a first transmit antenna in a wireless transmitter that supports transmit diversity and the output of the second switch set in the plurality of switch sets is coupled to an amplifier driving a second, different transmit antenna in the wireless transmitter that supports transmit diversity.

18. The system of claim 13, wherein:
the output of the first switch set in the plurality of switch sets is coupled to a power amplifier operative within a first frequency range and the output of the second switch set in the plurality of switch sets is coupled to a power amplifier operative within a second, different frequency range.

19. The system of claim 13, further comprising:
at least one filter coupled to the output of at least one of the plurality of switch sets of the output switching stage to provide filtration to a corresponding voltage signal.

20. The system of claim 12, wherein:
the magnetic regulation stage is capable of both boost and buck regulation; and
the switched-capacitor voltage balancer stage comprises a switched-capacitor ladder circuit.

21. The system of claim 12, wherein:
the magnetic regulation stage has multiple outputs, wherein each of the multiple outputs is coupled to a different voltage node in the plurality of voltage nodes of the switched-capacitor voltage balancer stage.

22. The system of claim 12, wherein the magnetic regulation stage further comprises:
an inductor having a first end and a second end;
a first switch coupled between the input of the magnetic regulation stage and the first end of the inductor;
a second switch coupled between the first end of the inductor and a first voltage node in the plurality of voltage nodes of the switched-capacitor voltage balancer stage;
a third switch coupled between the second end of the inductor and a first output of the magnetic regulation stage; and
a fourth switch coupled between the second end of the inductor and a second output of the magnetic regulation stage, wherein the first output of the magnetic regulation stage is coupled to one voltage node of the switched-capacitor voltage balancer stage and the second output of the magnetic regulation stage is coupled to another, different voltage node of the switched-capacitor voltage balancer stage.

* * * * *